United States Patent
Kamikawa

(10) Patent No.: US 7,361,518 B2
(45) Date of Patent: Apr. 22, 2008

(54) SEMICONDUCTOR ELEMENT, SEMICONDUCTOR DEVICE, AND METHOD FOR FABRICATION THEREOF

(75) Inventor: Takeshi Kamikawa, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 338 days.

(21) Appl. No.: 11/137,352

(22) Filed: May 26, 2005

(65) Prior Publication Data
US 2005/0277212 A1 Dec. 15, 2005

(30) Foreign Application Priority Data
Jun. 10, 2004 (JP) ............................. 2004-172326

(51) Int. Cl.
*H01L 21/00* (2006.01)

(52) U.S. Cl. ........................... 438/21; 438/45; 438/48; 438/478; 257/E39.005

(58) Field of Classification Search .................. 438/21
See application file for complete search history.

(56) References Cited

U.S. PATENT DOCUMENTS

| 5,648,668 | A | * | 7/1997 | Kasai ........................ 257/280 |
| 6,117,713 | A | * | 9/2000 | Hoshino et al. ............ 438/172 |
| 2002/0115267 | A1 | * | 8/2002 | Tomiya et al. .............. 438/478 |

FOREIGN PATENT DOCUMENTS

JP    2000-164986    6/2000

\* cited by examiner

*Primary Examiner*—Walter Lindsay, Jr.
*Assistant Examiner*—Abdulfattah Mustapha
(74) *Attorney, Agent, or Firm*—Morrison & Foerster LLP

(57) ABSTRACT

A nitride semiconductor growth layer is laid on a substrate having an engraved region provided with a depressed portion.

4 Claims, 15 Drawing Sheets

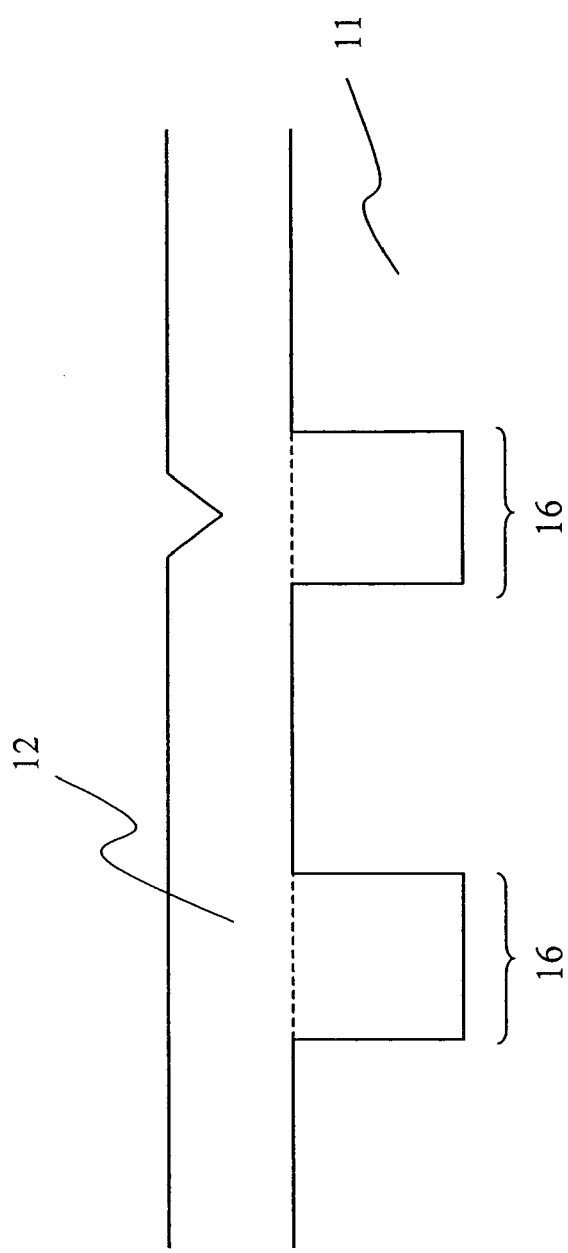
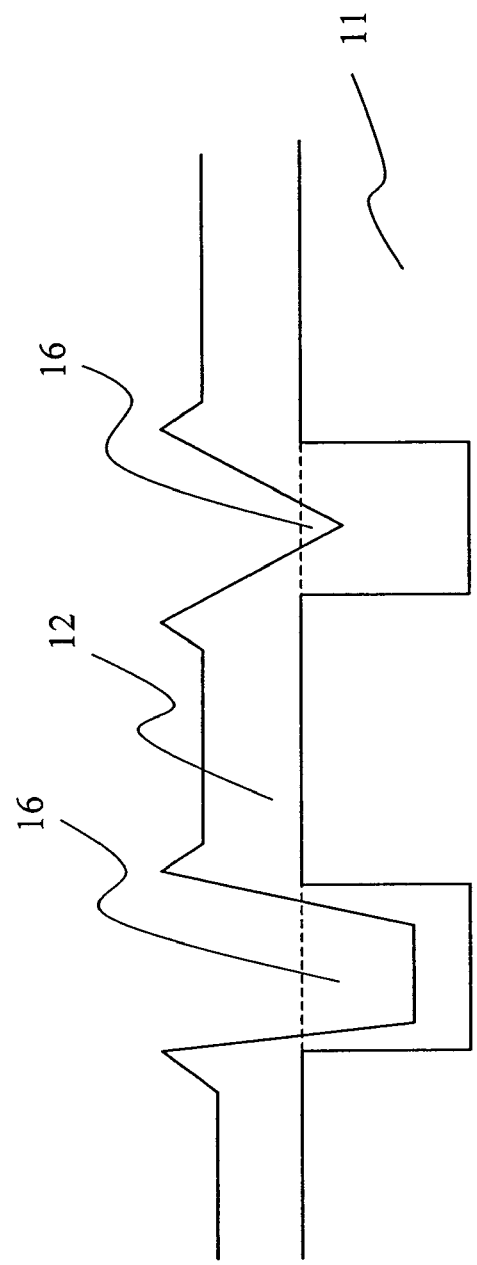
Fig.6a
Fig.6b

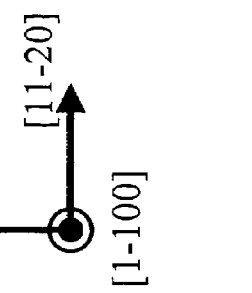
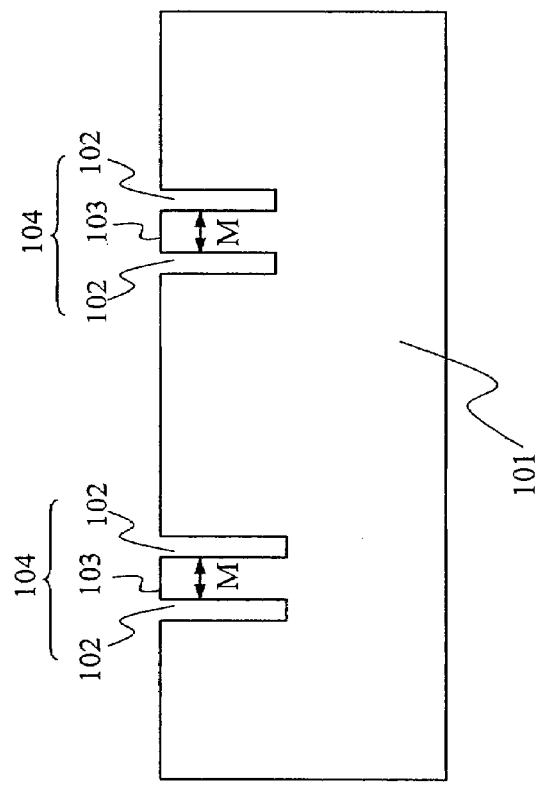
Fig.10a
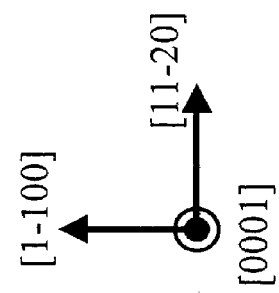
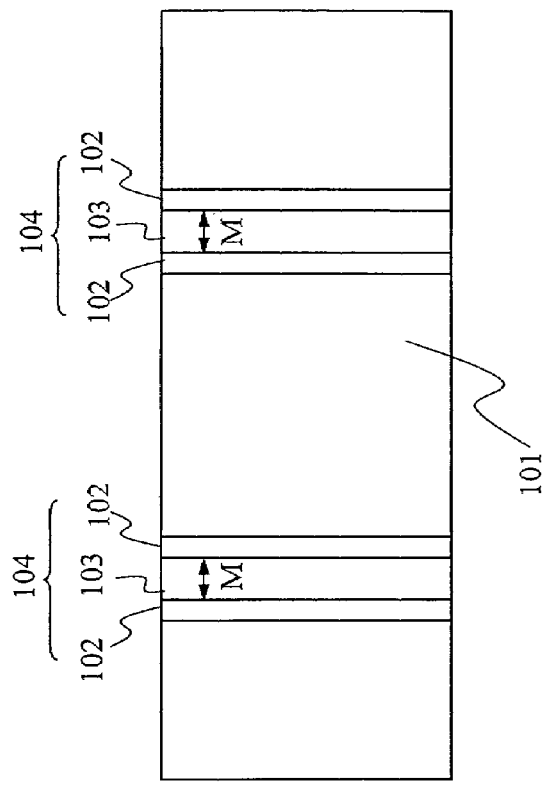
Fig.10b

SEMICONDUCTOR ELEMENT, SEMICONDUCTOR DEVICE, AND METHOD FOR FABRICATION THEREOF

This nonprovisional application claims priority under 35 U.S.C. § 119(a) on Patent Application No. 2004-172326 filed in Japan on Jun. 10, 2004, the entire contents of which are hereby incorporated by reference.

BACKGROUND OF THE INVENTION

1. Field of the Invention

The present invention relates to a semiconductor element such as a nitride semiconductor laser element, to a semiconductor device incorporating such a semiconductor element, and to a method for fabricating them.

2. Description of Related Art

In many conventional semiconductor elements, a top portion of a semiconductor growth layer is formed into a ridge-like shape by etching or the like and is sandwiched between different patches of an insulating film for current constriction. This structure is generally called a ridge-like structure. A semiconductor element having such a ridge-like structure can be mounted on a mount member such as a submount, for example, with the substrate side of the semiconductor element up and thus with the opposite side thereof, on which the semiconductor growth layer is epitaxially grown, down. This mounting method is called junction-down mounting. In the fabrication of a semiconductor device, when a semiconductor element is mounted by such junction-down mounting, the ridge portion of the semiconductor element, since it is elevated, may be damaged when exposed to pressure.

As one solution to this inconvenience, there has conventionally been proposed a semiconductor device that has dummy-ridge regions formed at either side of a ridge portion (see Japanese Patent Application Laid-open No. 2000-164986). Now, this semiconductor device will be described with reference to a drawing. FIG. 15 is a sectional view of a semiconductor element having dummy-ridge regions formed thereon, shown together with a mount member, composed of a submount, a stem, or the like, on which the semiconductor element is mounted.

The semiconductor element 10 shown in FIG. 15 has a semiconductor growth layer 2 laid on the surface of a substrate 1. The semiconductor element 10 has a ridge-like portion 8 formed thereon by etching or the like, and also has dummy-ridge regions 9 formed thereon on either side of the ridge-like portion 8 in such a way that the thickness of the semiconductor growth layer 2 as measured from the surface of the substrate 1 is greater in the dummy-ridge regions 9 than in the ridge-like portion 8. Moreover, a $SiO_2$ film 3 is laid for current constriction in such a way that different patches thereof sandwich the ridge-like portion 8, and a p-side electrode 4 is formed in such a way as to cover a portion of the surface of the semiconductor growth layer 2 around the ridge-like portion 8 as well as the surface of the ridge-like portion 8 itself.

In the mounting step, the semiconductor element 10 is fixed to a mount member with the substrate 1 side of the semiconductor element 10 up and with solder 5 laid in between. Here, the mount member is composed of a submount 6 and a stem 7. In this way, the ridge-like portion 8 is prevented from being pressed and thereby damaged. Moreover, good heat dissipation is achieved because the submount 6 is made of a high-thermal-conductivity material and the semiconductor element 10 is fixed thereto with the semiconductor growth layer 2, which generates heat, down.

The semiconductor device shown in FIG. 15 has the following inconvenience. In the semiconductor element 10, as viewed with the substrate 1 down, the surface of the dummy-ridge regions 9 needs to be made higher than the surface of the ridge-like portion 8. Thus, to form the dummy-ridge regions 9, it is necessary to perform a separate step for laying the semiconductor growth layer 2 in the dummy-ridge regions 9, or to adjust the thickness of the $SiO_2$ film 3. This leads to an increased number of steps being required in the process for the fabrication of semiconductor elements, making the process more complex and resulting in low yields.

SUMMARY OF THE INVENTION

In view of the conventionally encountered inconveniences described above, it is an object of the present invention to provide a semiconductor element that permits easy formation, on either side of a ridge formed as an elevated portion, of dummy-ridge portions thicker than the ridge portion through the laying of a nitride semiconductor growth layer on a substrate having formed thereon an engraved region provided with a depressed portion, to provide a semiconductor device incorporating it, and to provide a method for fabricating them.

To achieve the above object, according to the present invention, a method for fabricating a semiconductor element includes: a first step of producing a processed substrate by forming, on a substrate having a nitride semiconductor layer as at least part of the surface thereof, an engraved region including at least one depressed portion and a ridge portion as a non-engraved region; and a second step of laying a nitride semiconductor layered-structure portion including at least one type of nitride semiconductor thin film both in the engraved region and on the surface of the ridge portion. Here, in the second step, a first dummy-ridge portion is formed on a region of the ridge portion close to the engraved region by making the thickness of the nitride semiconductor layered-structure portion laid on the region of the ridge portion close to the engraved region as measured from the surface of the ridge portion to the surface of the nitride semiconductor layered-structure portion greater than the thickness of the nitride semiconductor layered-structure portion laid on a semiconductor element production region, which is a region of the ridge portion other than the region thereof close to the engraved region, as measured from the surface of the ridge portion to the surface of the nitride semiconductor layered-structure portion.

According to the present invention, in the semiconductor element fabrication method described above, in the second step, when the nitride semiconductor layered-structure portion is formed, the depressed portion of the engraved region is not completely filled.

According to the present invention, in the semiconductor element fabrication method described above, in the second step, the nitride semiconductor thin film that constitutes the nitride semiconductor layered-structure portion includes an AlGaN layer whose Al content ratio is 0.03 or more and whose total thickness is 1 μm or more.

According to the present invention, in the semiconductor element fabrication method described above, in the second step, the thickness of the nitride semiconductor layered-structure portion laid on the first dummy-ridge portion as measured from the surface of the ridge portion to the surface of the nitride semiconductor layered-structure portion is made 200 nm or more thicker than the thickness of the nitride semiconductor layered-structure portion laid on the semiconductor element production region as measured from the surface of the ridge portion to the surface of the nitride semiconductor layered-structure portion.

According to the present invention, in the semiconductor element fabrication method described above, in the first step, the engraved region is so formed as to include two or more depressed portions and a narrow flat portion sandwiched therebetween, the narrow flat portion having a width of 100 µm or less in the direction perpendicular to a first direction in which the engraved region extends, and, in the second step, a second dummy-ridge portion is formed in the narrow flat portion by making the thickness of the nitride semiconductor layered-structure portion laid on the narrow flat portion as measured from the surface of the narrow flat portion to the surface of the nitride semiconductor layered-structure portion greater than the thickness of the nitride semiconductor layered-structure portion laid on the semiconductor element production region as measured from the surface of the ridge portion to the surface of the nitride semiconductor layered-structure portion.

According to the present invention, in the semiconductor element fabrication method described above, in the first step, the engraved region is so formed as to include three depressed portions and two narrow flat portions sandwiched therebetween, the narrow flat portions each having a width of 100 pm or less in the direction perpendicular to a first direction in which the engraved region extends, and, in the second step, two second dummy-ridge portions are formed in the narrow flat portions by making the thickness of the nitride semiconductor layered-structure portion laid on the narrow flat portions as measured from the surface of the narrow flat portions to the surface of the nitride semiconductor layered-structure portion greater than the thickness of the nitride semiconductor layered-structure portion laid on the semiconductor element production region as measured from the surface of the ridge portion to the surface of the nitride semiconductor layered-structure portion.

According to the present invention, the semiconductor element fabrication method described above further includes: a third step of producing a semiconductor element in the semiconductor element production region formed in the second step; a fourth step of cleaving the processed substrate in the direction perpendicular to the first direction to form a bar having a plurality of the semiconductor elements mounted thereon; and a fifth step of performing chip separation by splitting the bar in the direction parallel to the first direction to separate the semiconductor elements on the bar into discrete chips. Here, in the fifth step, the chip separation is performed after forming a scribe line parallel to the first direction by performing scribing on the top surface of the nitride semiconductor layered-structure portion laid in the engraved region or on the bottom surface of the part of the processed substrate located right below the engraved region.

According to the present invention, the semiconductor element fabrication method described above further includes: a third step of producing a semiconductor element in the semiconductor element production region formed in the second step; a fourth step of cleaving the processed substrate in the direction perpendicular to the first direction to form a bar having a plurality of the semiconductor elements mounted thereon; and a fifth step of performing chip separation by splitting the bar in the direction parallel to the first direction to separate the semiconductor elements on the bar into discrete chips. Here, in the fifth step, the chip separation is performed after forming a scribe line parallel to the first direction by performing scribing in a middle portion on the second dummy-ridge portion or on the bottom surface of the part of the processed substrate located right below the second dummy-ridge portion.

According to the present invention, the semiconductor element fabrication method described above further includes: a third step of producing a semiconductor element in the semiconductor element production region formed in the second step; a fourth step of cleaving the processed substrate in the direction perpendicular to the first direction to form a bar having a plurality of the semiconductor elements mounted thereon; and a fifth step of performing chip separation by splitting the bar in a direction parallel to the first direction to separate the semiconductor elements on the bar into discrete chips. Here, in the fifth step, the chip separation is performed after forming a scribe line parallel to the first direction by performing scribing in the nitride semiconductor layered-structure portion laid in the depressed portion sandwiched between the two narrow flat portions in the engraved region or on the bottom surface of the part of the processed substrate located right below that depressed portion.

Moreover, according to the present invention, a semiconductor element is fabricated by one of the semiconductor element fabrication methods described above.

Moreover, according to the present invention, a semiconductor device is provided with: the above-described semiconductor element according to the present invention; and a mount member on which the semiconductor element is mounted. Here the semiconductor element is mounted on the mount. member in such a way that the semiconductor element makes contact with the surface of the mount member with the nitride semiconductor layered-structure portion side of the semiconductor element down.

Moreover, according to the present invention, a method for fabricating a semiconductor element includes: a first step of producing a processed substrate by forming, on a substrate having a nitride semiconductor layer as at least part of the surface thereof, an engraved region including at least one depressed portion and a ridge portion as a non-engraved region; and a second step of laying a nitride semiconductor layered-structure portion including at least one type of nitride semiconductor thin film both in the engraved region and on a surface of the ridge portion. Here, in the first step, the engraved region is formed in a grid-like shape and adjacent ones of the engraved regions are formed parallel to and at varying intervals from one another so as to form a plurality of non-engraved regions having varying areas, and, in the second step, the thickness, as measured from the surface of the ridge portion to the surface of the nitride semiconductor layered-structure portion, of the nitride semiconductor layered-structure portion laid on the non-engraved regions is varied according to the thickness of the surface of the ridge portion.

Moreover, according to the present invention, a semiconductor element is fabricated by the semiconductor element fabrication method described above.

BRIEF DESCRIPTION OF THE DRAWINGS

FIGS. 6a and 6b are diagrams illustrating the degree of filling of engraved regions by nitride semiconductor thin films;

FIGS. 10a and 10b are a schematic sectional view and a top view, respectively, of part of a processed substrate before a nitride semiconductor growth layer is laid thereon in the second embodiment of the invention;

DETAILED DESCRIPTION OF PREFERRED EMBODIMENTS

Figure 1:
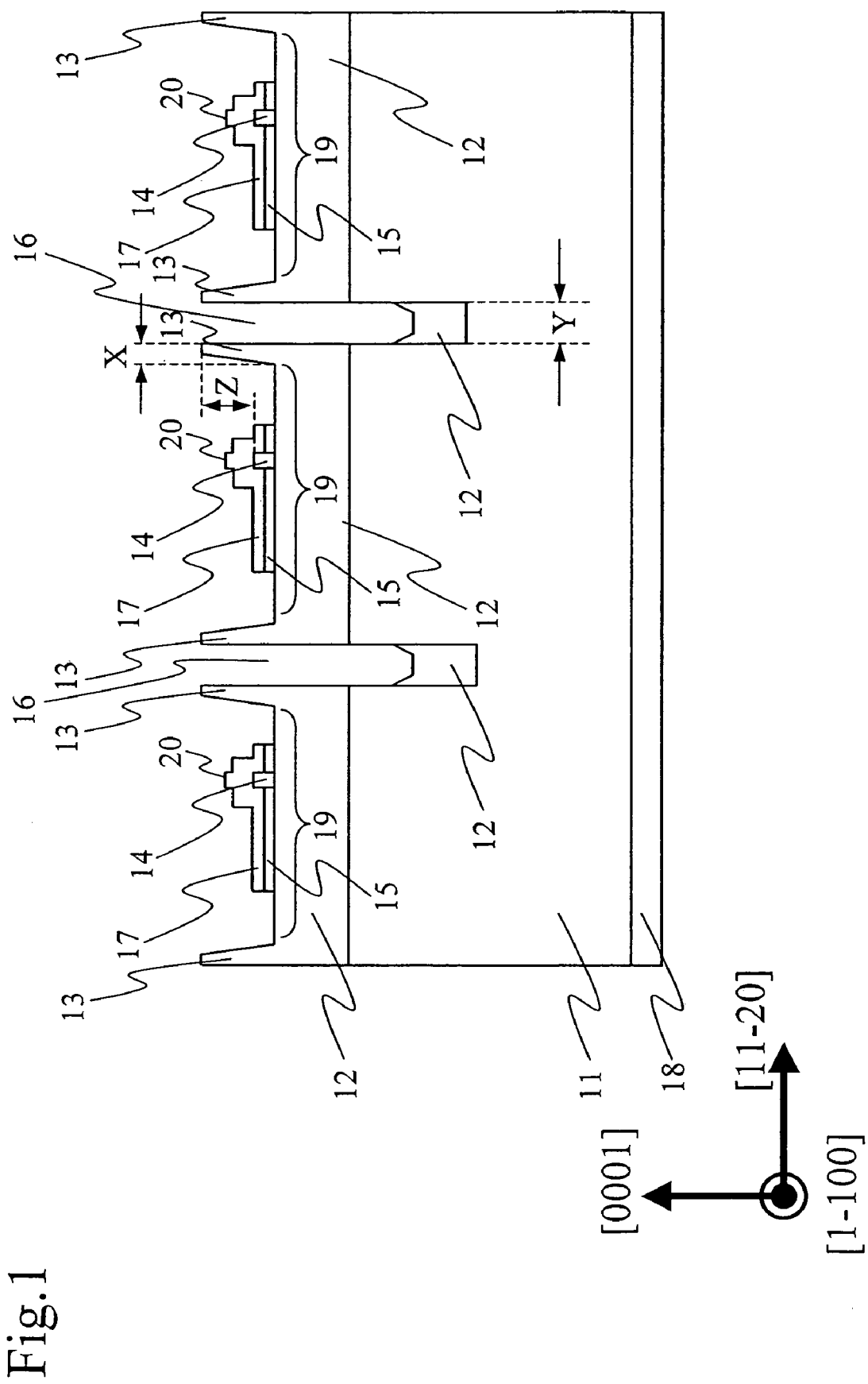
FIG. 1 is a schematic sectional view of part of a wafer having nitride semiconductor laser elements formed thereon in a first embodiment of the invention.

Hereinafter, various embodiments of the present invention will be described. Before that, some terms that are frequently used in the following descriptions will be defined. In the present specification, an "engraved region" denotes, for example, a groove formed as a depressed portion in the shape of a stripe on the surface of a processed substrate 11 as shown in FIGS. 2a and 2b, and a "ridge" denotes a region formed as an elevated portion in the shape of a stripe elsewhere than in any depressed portion. In FIGS. 2a and 2b, grooves and ridges are formed in the shape of stripes extending in one direction. Alternatively, grooves and ridges may be formed in the shape of a grid, with the grooves crossing one another and the ridges crossing one another. Each engraved region may consist of a single depressed portion, or of a combination of a plurality of consecutive depressed portions with one or more flat portions sandwiched therebetween.

In the present specification, a "nitride semiconductor substrate" denotes a substrate formed of $Al_xGa_yIn_zN$ ($0 \leq x \leq 1$, $0 \leq y \leq 1$, $0 \leq z \leq 1$, and $x+y+z=1$). Of the n element contained in the nitride semiconductor substrate, about 10% or less may be replaced with the element As, P, or Sb (provided that the substrate maintains a hexagonal crystal structure). The nitride semiconductor substrate may be doped with Si, O, Cl, S, C, Ge, Zn, Cd, Mg, or Be. Among these dopants, particularly preferred for an n-type nitride semiconductor are Si, O, and Cl. The preferred orientation of the principal plane of the nitride semiconductor substrate is that of the C plane {0001}, the A plane {11-20}, the R plane {1-102}, the M plane {1-100}, or the {1-101} plane. So long as the principal pla of the substrate has an off-angle of 2° or less from the orientation of one of the just mentioned crystal planes, it is possible to obtain satisfactory surface morphology.

In the present specification, a "dissimilar substrate" denotes a substrate formed of a material other than a nitride semiconductor. Used as a dissimilar substrate is, for example, a sapphire substrate, a SiC substrate, a Si substrate, or a GaAs substrate.

In the present specification, a "processed substrate" denotes a nitride semiconductor substrate, or a substrate that has engraved regions formed on the surface of a nitride semiconductor substrate or on the surface of nitride semiconductor thin films laid on the surface of a dissimilar substrate. The engraved regions may be formed at fixed intervals, or may be formed with varying widths. The engraved regions may be formed with a fixed depth, or may be formed with varying depths.

In the present specification, a "nitride semiconductor laser element" denotes any of the discrete chips produced by laying a nitride semiconductor growth layer on a processed substrate, then forming on top thereof a ridge portion and an electrode layer through various steps, and then splitting the product into discrete chips.

In the present specification, a "nitride semiconductor laser device" denotes a product obtained by mounting a nitride semiconductor laser element junction-down on a mount member such as a stem or a submount.

In the present specification, a "mount member" denotes a stem, or a submount mounted on a stem, on which a nitride semiconductor laser element is mounted. Thus, in the present specification, "mounting a nitride semiconductor laser element junction-down on a mount member" means either "mounting a nitride semiconductor laser element junction-down directly on a stem" or "mounting a nitride semiconductor laser element junction-down on a submount mounted on a stem".

FIRST EMBODIMENT

Figure 2:
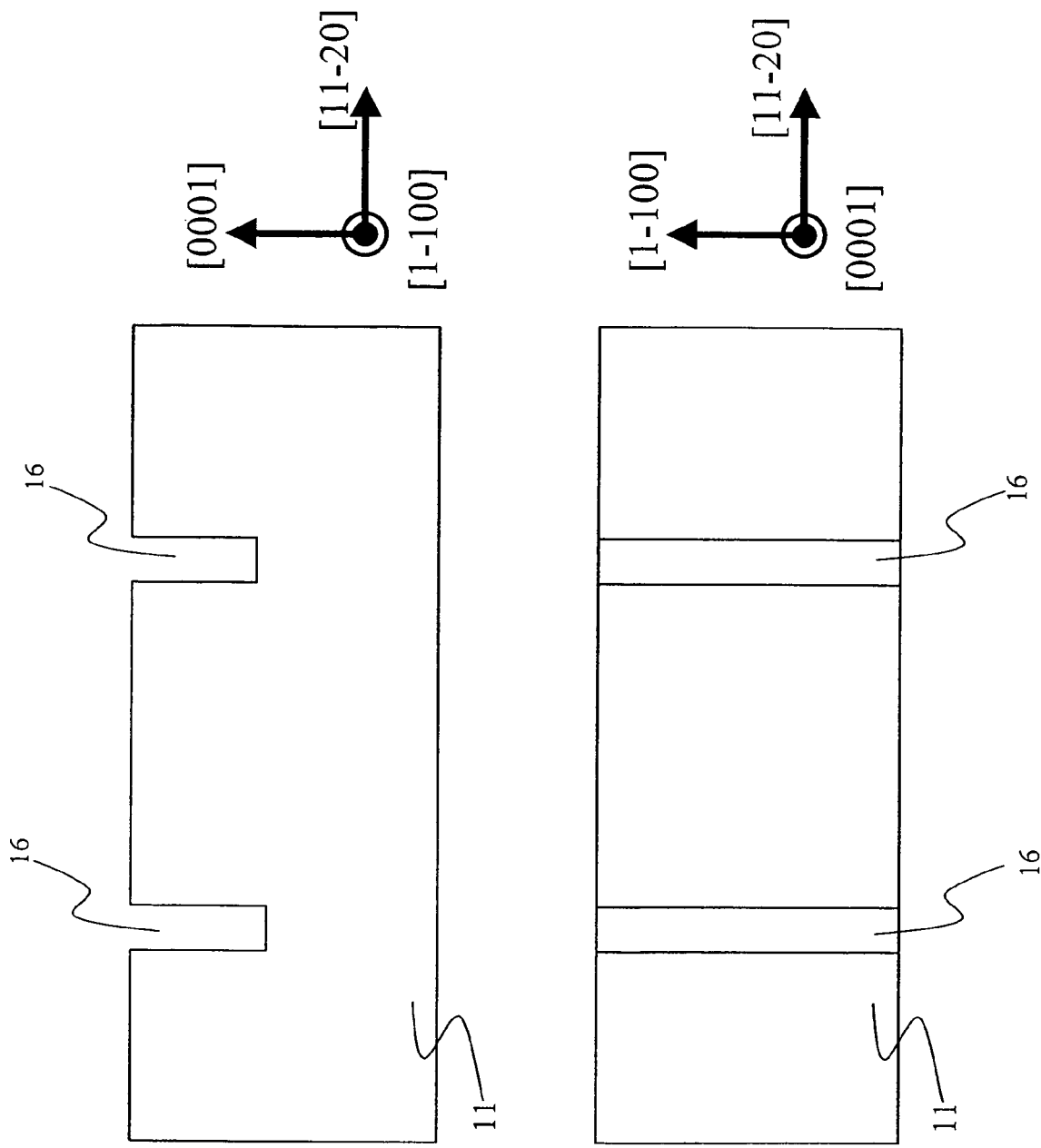
FIGS. 2a and 2b are a schematic sectional view and a top view, respectively, of part of a processed substrate before a nitride semiconductor growth layer is laid thereon in the first embodiment of the invention.
Figure 3:
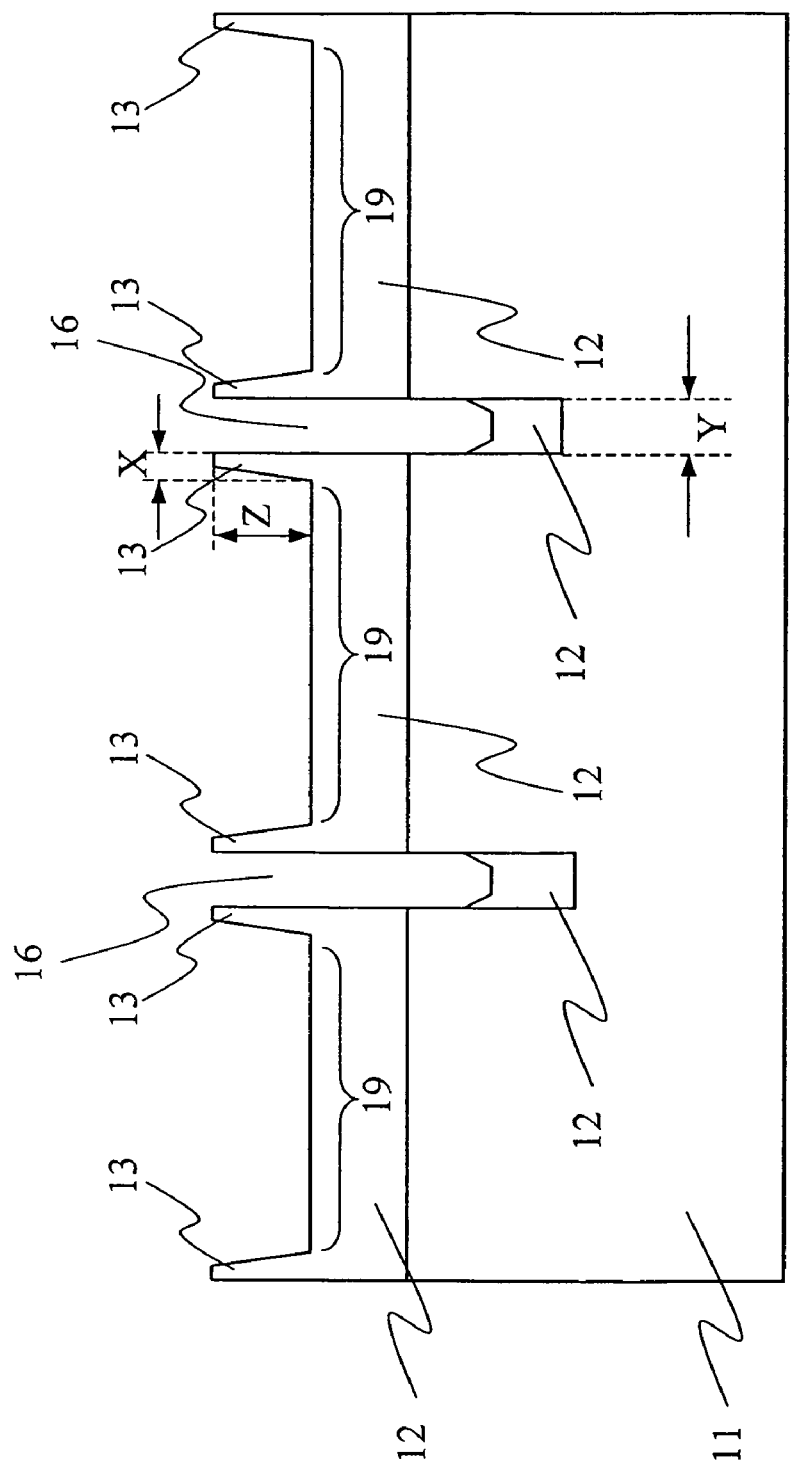
FIG. 3 is a schematic sectional view of part of a processed substrate after a nitride semiconductor growth layer is laid thereon in the first embodiment of the invention.
Figure 4:
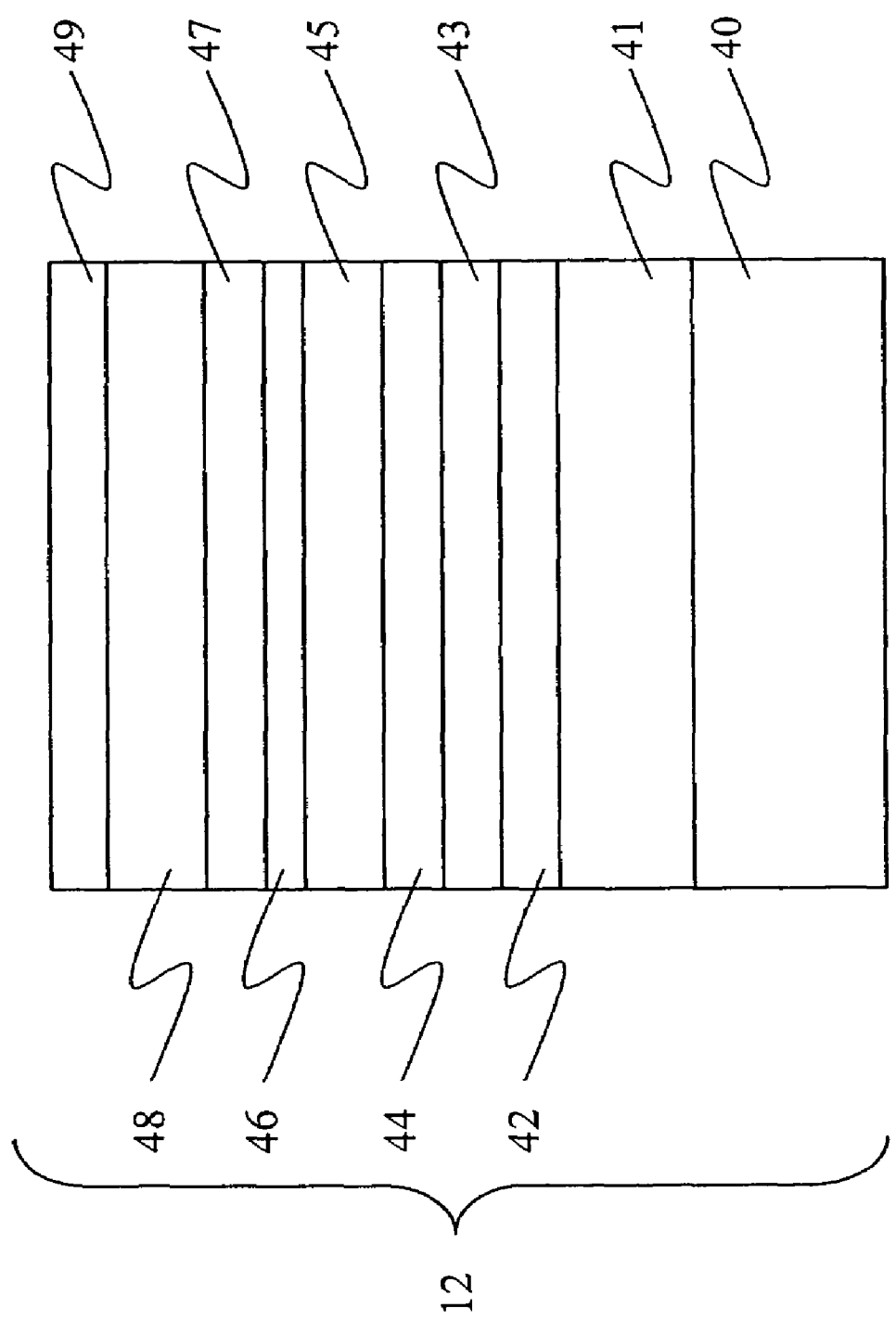
FIG. 4 is a schematic sectional view showing the structure of a nitride semiconductor growth layer according to the invention.

A first embodiment of the invention will be described below with reference to the relevant drawings. This embodiment deals with a nitride semiconductor laser element as an example of a semiconductor element. FIG. 1 is a schematic sectional view of the nitride semiconductor laser element of this embodiment. FIG. 2a is a schematic sectional view of a processed substrate 11 before a nitride semiconductor growth layer 12 as shown in FIG. 4 is laid thereon, and FIG. 2b is a top view of FIG. 2a. In each of these diagrams, the plane orientations are shown together. FIG. 3 is a schematic sectional view of a wafer having the nitride semiconductor growth layer 12 laid on the processed substrate 11 shown in FIGS. 2a and 2b.

In connection with this nitride semiconductor laser element, first, how the processed substrate 11 is produced will be described with reference to the drawings. In this embodiment, an n-type GaN substrate is used as the material of the processed substrate 11. To produce the processed substrate 11 shown in FIG. 2, first, on the top surface of the n-type GaN substrate is vapor-deposited $SiO_2$, $SiN_x$, or the like. In this embodiment, a $SiO_2$ film is formed on the surface of the n-type GaN substrate by vapor-depositing $SiO_2$; instead, a film of any other dielectric material may be formed on the surface of the n-type GaN substrate. Vapor deposition is achieved by electron beam deposition, sputtering deposition, or the like. The $SiO_2$ film or the like does not necessarily have to be formed by vapor deposition, but may be formed by plasma CVD or the like. Next, a resist material is applied to this $SiO_2$ film, and then, by ordinary lithography, a resist pattern having openings in the shape of stripes is formed in the [1-100] direction. Next, by RIE (reactive ion etching) using ICP (inductively coupled plasma) or the like, the $SiO_2$ film is etched down halfway into the n-type GaN substrate. Subsequently, the resist remaining on the n-type GaN substrate is removed, and then, by using as a hard mask the $SiO_2$ film that has been left unetched, the n-type GaN substrate is etched to form engraved regions 16 as depressed portions. Thereafter, by using an etchant such as HF (hydrofluoric acid), the $SiO_2$ film is removed. In this way is produced the processed substrate 11 having the engraved regions 16 formed to extend in the [1-100] direction as shown in FIG. 2. In this embodiment, RIE is used to etch the n-type GaN substrate and form the engraved regions 16; instead, wet etching or the like may be used.

In the above description, the processed substrate 11 is formed by digging the engraved regions 16 directly on the surface of the n-type GaN substrate. Alternatively, the processed substrate 11 may be formed by first growing nitride semiconductor thin films such as GaN, InGaN, AlGaN, and InAlGaN on the surface of the n-type GaN substrate and then digging the engraved regions 16. Alternatively, the processed substrate 11 may be formed by first growing nitride semiconductor thin films on the surface of a dissimilar substrate and then digging the engraved regions 16.

The engraved regions 16 formed as described above are formed on the top surface of the processed substrate 11 so as to run parallel to the [1-100] direction. The openings of the engraved regions 16 are each 5 μm wide and 5 μm deep. The interval between adjacent engraved regions 16 as measured in the direction parallel to the [11-20] direction, i.e., the period of the engraved regions 16, is 400 μm.

On the processed substrate 11 produced through the steps described above, a nitride semiconductor growth layer 12 as shown in FIG. 4 is epitaxially grown by appropriately using well-known techniques such as MOCVD (metallorganic chemical vapor deposition). In this way is produced the nitride semiconductor laser element shown in FIG. 1. Since the nitride semiconductor growth layer 12 is formed by appropriately using well-known techniques, no detailed explanations will be given in this respect.

As shown in FIG. 4, the nitride semiconductor growth layer 12 is formed by laying on the surface of the processed substrate 11 the following layers in the order named: a 2.0 μm thick n-type GaN layer 40; a 1.5 μm thick n-type $Al_{0.062}Ga_{0.938}N$ first clad layer 41; a 0.2 μm thick n-type $Al_{0.1}Ga_{0.9}N$ second clad layer 42; a 0.1 μm n-type $Al_{0.062}Ga_{0.938}N$ third clad layer 43; a 0.1 μm thick n-type GaN guide layer 44; a multiple quantum well active layer 45 composed of three 4 nm thick InGaN well layers and four 8 nm thick GaN barrier layers; a 20 nm thick p-type $Al_{0.3}Ga_{0.7}N$ evaporation prevention layer 46; a 0.08 μm thick p-type GaN guide layer 47; a 0.5 μm thick p-type $Al_{0.062}Ga_{0.938}N$ clad layer 48; and a 0.1 μm thick p-type GaN contact layer 49. The multiple quantum well active layer 45 is formed by laying its constituent layers in the following order: a barrier layer, a well layer, barrier layer, a well layer, barrier layer, a well layer, and a barrier layer.

The nitride semiconductor growth layer 12 structured as described above is epitaxially grown on the previously described processed substrate 11 to produce the nitride semiconductor laser element shown in FIG. 1.

The nitride semiconductor laser element shown in FIG. 1 thus has the nitride semiconductor growth layer 12, having a layered structure consisting of a plurality of nitride semiconductor thin films as shown in FIG. 4, formed on the processed substrate 11 produced as described above so as to have the engraved regions 16. Moreover, on the surface of the nitride semiconductor growth layer are formed, by dry etching or the like, ridge stripes 14 serving as laser light waveguides and a $SiO_2$ film 15 for current constriction in such a way that the ridge stripes 14 are sandwiched between different patches of the $SiO_2$ film 15. Then, on the surface of the ridge stripes 14 and of the $SiO_2$ film 15, p-side electrodes 17 are formed, and, on the bottom surface of the processed substrate 11, an n-side electrode 18 is formed. The elevated portions on the surface of the p-side electrodes 17 are called stripes 20. Along both edge portions of the ridges close to the engraved regions 16, dummy-ridge portions 13 are formed by growing the nitride semiconductor growth layer 12 thicker than in the flat portions where the nitride semiconductor laser elements are formed. With the nitride semiconductor growth layer 12 formed in this way, the engraved regions 16 are not completely filled by the nitride semiconductor growth layer 12 formed in the grooves.

The ridge stripes 14 mentioned above are formed by forming, by ordinary photolithography, a resist pattern in the shape of stripes, with a resist width of 2 μm, extending in the [1-100] direction (resonator direction) and then performing etching by RIE (reactive ion etching) using a plasma source such as ICP (inductively coupled plasma). Here, etching is performed from the surface of the nitride semiconductor growth layer 12 down to immediately above the p-type GaN guide layer 47 or the multiple quantum well active layer 45.

The p-side electrodes 17 are formed by laying layers of materials such as Pd/Mo/Au in this order from the side thereof closer to the nitride semiconductor growth layer 12. Any other combination of materials may be used instead, such as Pd/Pt/Au or Ni/Au laid in this order. Likewise, the n-side electrode 18 is formed by laying layers of materials such as Ti/Al/Pt/Au in this order from the side thereof closer to the bottom surface of the processed substrate 11. Any other combination of materials may be used instead.

Next, the dummy-ridge portions 13 shown in FIG. 1 will be described with reference to the drawings. When a nitride semiconductor growth layer 12 having a layered structure as shown in FIG. 4 is laid on the processed substrate 11 shown in FIG. 2, dummy-ridge portions 13 are formed along both edge portions of the ridges close to the engraved regions 16 as shown in FIG. 3, which shows a section of the wafer. The portions of the nitride semiconductor growth layer 12 that form the dummy-ridge portions 13 are thicker than the portions of the nitride semiconductor growth layer 12 laid in the other regions on the ridges. In the following descriptions, the regions on the ridges other than the dummy-ridge portions 13 are called "laser element production regions 19".

This difference in the thickness of the nitride semiconductor growth layer 12 between in the dummy-ridge portions 13 and in the laser element production regions 19 results from the nitride semiconductor thin films growing at a higher growth rate in the dummy-ridge portions 13 close to the engraved regions 16 than in the laser element production regions 19. This great difference in the growth rate of the nitride semiconductor thin films between in the dummy-ridge portions 13 and in the laser element production regions 19 is due to the difference in re-evaporation probability, i.e., the probability with which the atoms and molecules of the source materials of the nitride semiconductor thin films that have once been absorbed by the growth surface of the nitride semiconductor thin films evaporate back from the growth surface without forming the nitride semiconductor thin films.

Specifically, the atoms and molecules of the source materials that have attached to the surface of the ridges between the engraved regions 16 migrate or otherwise move to stable-energy regions, where they bind to the atoms and molecules of the surface to form the nitride semiconductor thin films. However, if they cannot move to stable-energy regions within a predetermined length of time, they re-evaporate from the growth surface. It is known that, when engraved regions 16 are formed on the surface of a substrate as on the processed substrate 11, the most stable-energy portions of the ridges between the engraved regions 16 are edge portions thereof located close to the engraved regions 16. Thus, the re-evaporation probability is low in the edge portions of the ridges close to the engraved regions 16. As a result, the nitride semiconductor thin films grow at a higher rate in the both edge portions of the ridges close to the engraved regions 16 than in the laser element production regions 19, i.e., the other portions of the ridges. Thus, the dummy-ridge portions 13 are formed.

When the nitride semiconductor growth layer 12 is formed in this way, in this embodiment, the thickness of the nitride semiconductor growth layer 12 shown in FIG. 4 as measured in the laser element production regions 19 immediately after it is laid is approximately 4.64 µm. The thickness difference Z between in the dummy-ridge portions 13 and in the laser element production regions 19 is approximately 0.9 µm (that is, the thickness of the nitride semiconductor growth layer 12 laid on the processed substrate 11 in the dummy-ridge portions 13 is approximately 5.54 µm). The width X of the dummy-ridge portions 13 in the direction parallel to the [11-20] direction (see FIG. 1) is 30 µm.

The difference in re-evaporation probability and other factors give the dummy-ridge portions 13 a greater thickness than the laser element production regions 19. The reason is believed to be, based on the graph shown in FIG. 5, the difference in the thickness of the AlGaN layer. The graph shown in FIG. 5 also shows that, the lower the Al content ratio, the smaller the thickness difference Z between the dummy-ridge portions 13 and the laser element production regions 19 tends to be, and that, when the Al content ratio is zero, i.e., with GaN films, the thickness difference Z is zero. The reason is believed to be that, as compared with AlGaN, GaN migrates on the growth surface more easily and thus the atoms and molecules of its source materials spread evenly within the growth surface, giving the grown film a uniform thickness within the growth surface.

Figure 5:
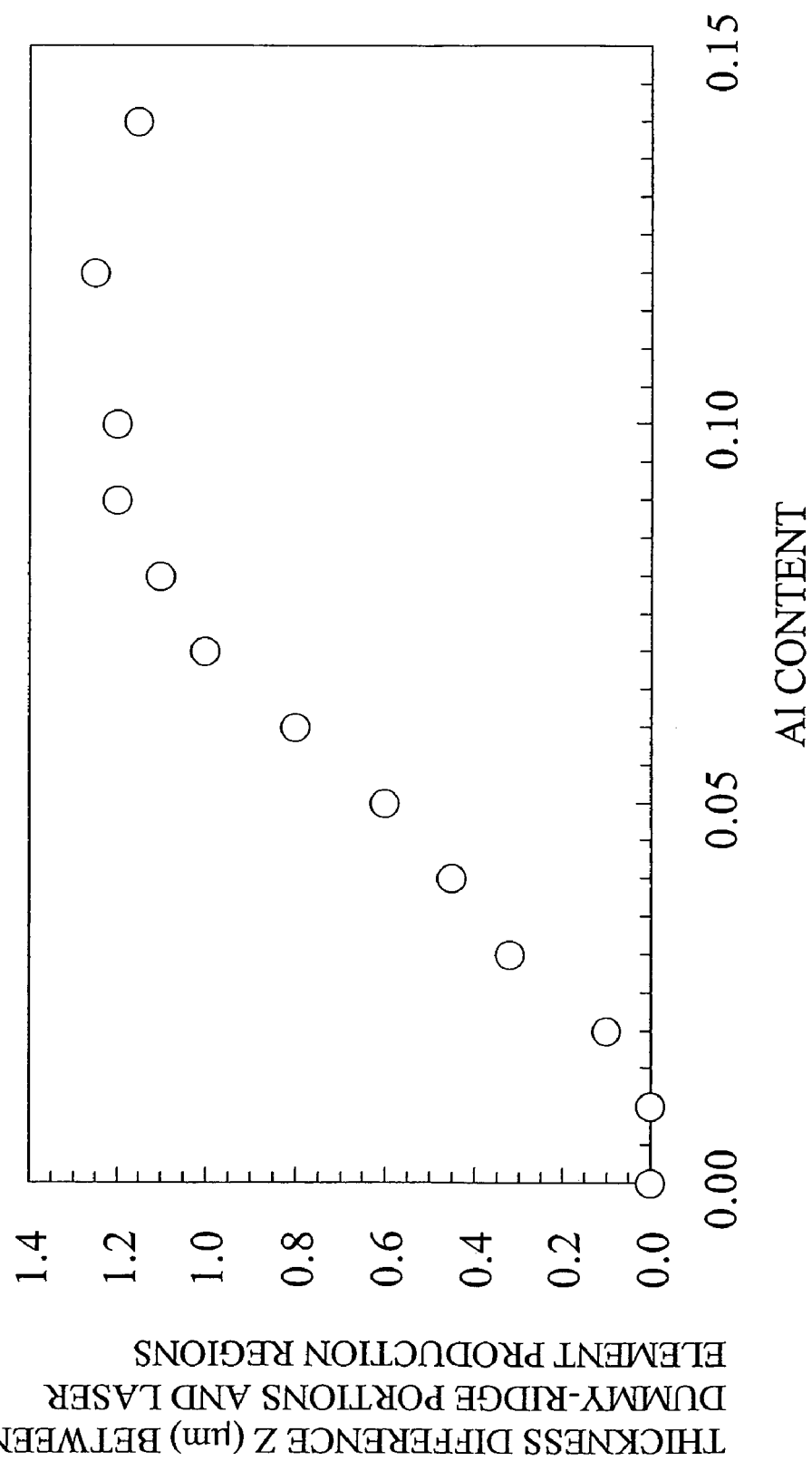
FIG. 5 is a diagram showing the correlation between the Al content ratio in an AlGaN film and the thickness difference Z between a dummy-ridge portion and a laser element production region.

FIG. 5 is a graph showing the correlation between the Al content ratio of the AlGaN layer included in the nitride semiconductor growth layer 12 and the thickness difference Z (see FIG. 3) between the dummy-ridge portions 13 and the laser element production regions 19. With respect to the Al content ratio shown in FIG. 5, a film with an Al content ratio of 0.1 is, for example, one formed of $Al_{0.1}Ga_{0.9}N$. The results shown in FIG. 5 are those obtained when a 0.52 µm p-type AlGaN layer and a 1.8 µm thick n-type AlGaN layer are grown, with predetermined Al content ratios, on the processed substrate 11 shown in FIG. 2. Thus, the total thickness of the AlGaN layer grown on the laser element production regions 19 is 2.32 µm, which is equal to the sum of the design thicknesses of the p-type AlGaN layer and the n-type AlGaN layer shown in FIG. 4.

In this way, growing nitride semiconductor thin films on the processed substrate 11 having engraved regions 16 formed thereon makes it possible to obtain varying thicknesses within the growth surface. Specifically, the nitride semiconductor growth layer 12 having a layered structure as shown in FIG. 4 can be grown thicker in the dummy-ridge portions 13 close to the engraved regions 16 than in the laser element production regions 19. This eliminates the need to perform an extra step for forming the dummy-ridge portions 13; that is, the dummy-ridge portions 13 with a greater thickness can be formed simply by laying the nitride semiconductor growth layer 12 in those portions on the wafer at the same time as in the other regions. This helps realize a fabrication process simpler than can be conventionally realized.

Moreover, when the nitride semiconductor growth layer 12 was laid by MOCVD or the like on the processed substrate 11 having the engraved regions 16 formed thereon, no cracks were observed to have developed within the nitride semiconductor growth layer 12. In general, since the nitride semiconductor growth layer 12 is composed of a plurality of types of film having different lattice constants and thermal expansion coefficients, lattice mismatching or the like occurs, producing strains within the nitride semiconductor growth layer 12. This conventionally causes cracks to develop. By contrast, in this embodiment, the use of the processed substrate 11 having the engraved regions 16 formed thereon helps release the strains present within the nitride semiconductor growth layer 12 and thereby prevent the development of cracks. Here, the engraved regions 16 are not completely filled by the nitride semiconductor growth layer 12, and this is considered to promote the releasing of strains.

What is referred to in this embodiment as the state in which the engraved regions 16 are not completely filled by the nitride semiconductor growth layer 12 is a state in which, as shown in a schematic sectional view of the wafer in FIG. 6b, grooves exist as depressed portions in the engraved regions 16. By contrast, in a state in which, as shown in FIG. 6a, the engraved regions 16 are completely filled by the nitride semiconductor growth layer 12 and thus no grooves exist, when the nitride semiconductor growth layer 12 is laid in the manner described above, the nitride semiconductor growth layer 12 cannot be formed thicker in the dummy-ridge portions 13 than in the laser element production regions 19. Hence, regardless of whether the surface of the nitride semiconductor growth layer 12 is flat or not, it is assumed that the state shown in FIG. 6a is not considered in this embodiment.

By the above-described method according to this embodiment, a wafer is produced that has the nitride semiconductor growth layer 12 laid without cracks on the surface of the processed substrate 11 having the engraved regions 16 formed thereon and that has the laser element production regions 19 and the dummy-ridge portions 13 formed thereon. In the laser element production regions 19 on this wafer, the ridge stripes 14, the $SiO_2$ film 15, and the p-side electrodes 17 are formed to produce the nitride semiconductor laser element shown in FIG. 1.

After the ridge stripes 14, the $SiO_2$ film 15, and the p-side electrodes 17 are formed in the laser element production regions 19 in this way, subsequently the processed substrate 11 is polished or etched from the bottom surface thereof to remove part of the processed substrate 11 so as to reduce the thickness of the wafer to about 100 µm. Thereafter, the n-side electrode 18 is formed on the bottom surface of the processed substrate 11. Here, the n-side electrode 18 may be formed separately for each individual nitride semiconductor laser element, or may be formed continuously as a single layer as shown in FIG. 1.

The wafer thus obtained is then cleaved in the direction perpendicular to the resonator direction (the [1-100] direction, see FIG. 1), in which the ridge stripes 14 extend, to form two resonator end facets. Here, the resonator length is 600 µm. Through this step of cleaving the wafer, the wafer is split into bars. The thus separated bars each have a large number of nitride semiconductor laser elements formed in a row thereon. The cleaving performed in this step is achieved by first drawing scribe lines on the bottom surface of the wafer with a diamond pen or the like and then applying an adequate force to the wafer. Alternatively, scribe lines are drawn with a diamond pen only in part of the wafer, for example edge portions thereof, and then the wafer is cleaved by using the scribe lines as starting points. The resonator end facets may be formed by etching.

Figure 7:
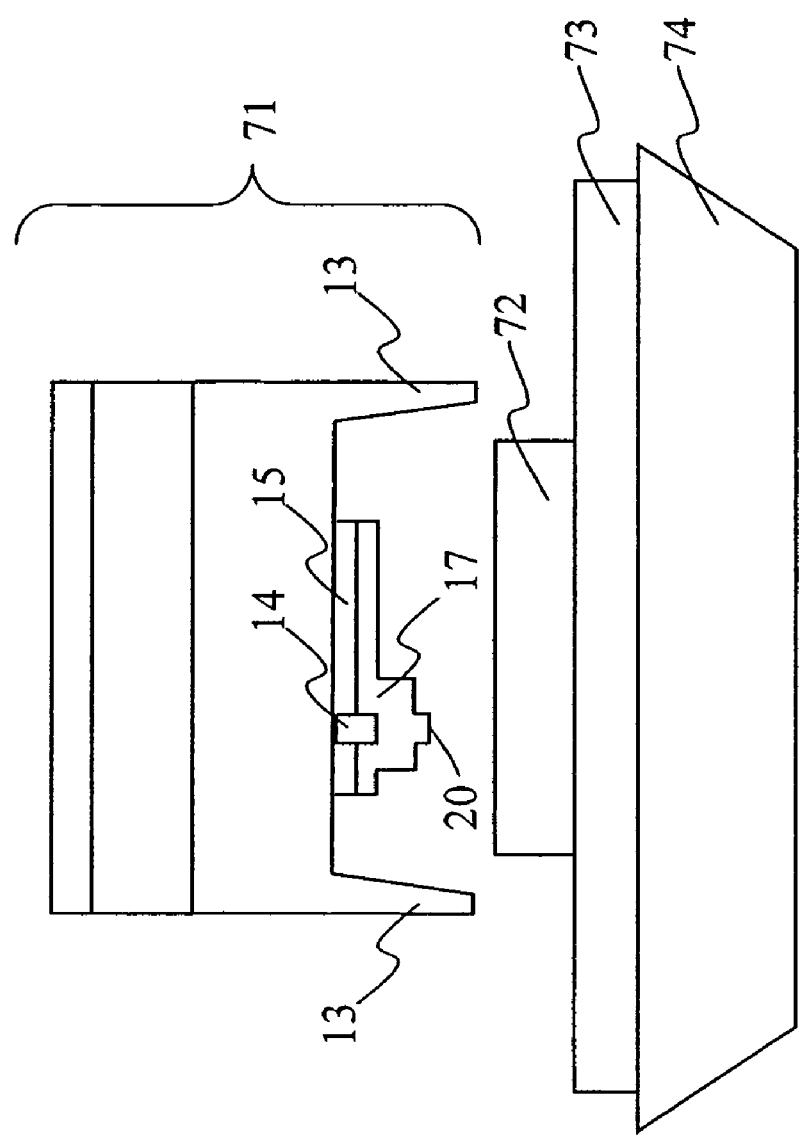
FIG. 7 is a diagram illustrating the junction-down mounting of a nitride semiconductor laser element in the first embodiment of the invention.

After the two resonator end facets are formed in this way, dielectric films of $SiO_2$ and $TiO_2$ are alternately vapor-deposited on those resonator end facets by electron beam deposition or the like to form dielectric multilayer reflective films. The dielectric materials do not necessarily have to be $SiO_2/TiO_2$, but may be, for example, $SiO_2/Al_2O_3$. Next, the bars each having a large number of nitride semiconductor laser elements formed in a row thereon as shown in FIG. 1 are split in the [1-100] direction, i.e., in the direction parallel to the ridge stripes 14, to obtain discrete nitride semiconductor laser elements (chips). Here, chip separation is performed with scribe lines drawn on the top surface of the nitride semiconductor growth layer 12 laid in the engraved regions 16 or on the bottom surface of the part of the processed substrate 11 located right below the engraved regions 16. In this way is produced the nitride semiconductor laser element 71 shown in FIG. 7.

The nitride semiconductor laser element 71 thus obtained is, with the p-side electrode 17 side thereof down, mounted on and fixed to the surface of a submount 73, with solder 72 laid in between. In this way is produced a nitride semiconductor laser device having the nitride semiconductor laser element 71 mounted junction-down on a mount member composed of the submount 73 placed on top of a stem 74. Here, the tips of the dummy-ridge portions 13 protrude more than the ridge stripe 14 and the stripe 20 do. Consequently, when the nitride semiconductor laser element is mounted on the surface of the submount 73, the ridge stripe 14 and the stripe 20 are prevented from receiving pressure, and thus the ridge stripe 14 is prevented from being damaged. Thus, nitride semiconductor laser elements 71 can be mounted on mount members at high yields. In this embodiment, the nitride semiconductor laser element 71 is mounted on the submount 73 with the solder 72 laid in between. Alternatively, the nitride semiconductor laser element 71 may be mounted directly on the stem 74 with the solder 72 laid in between.

Figure 8:
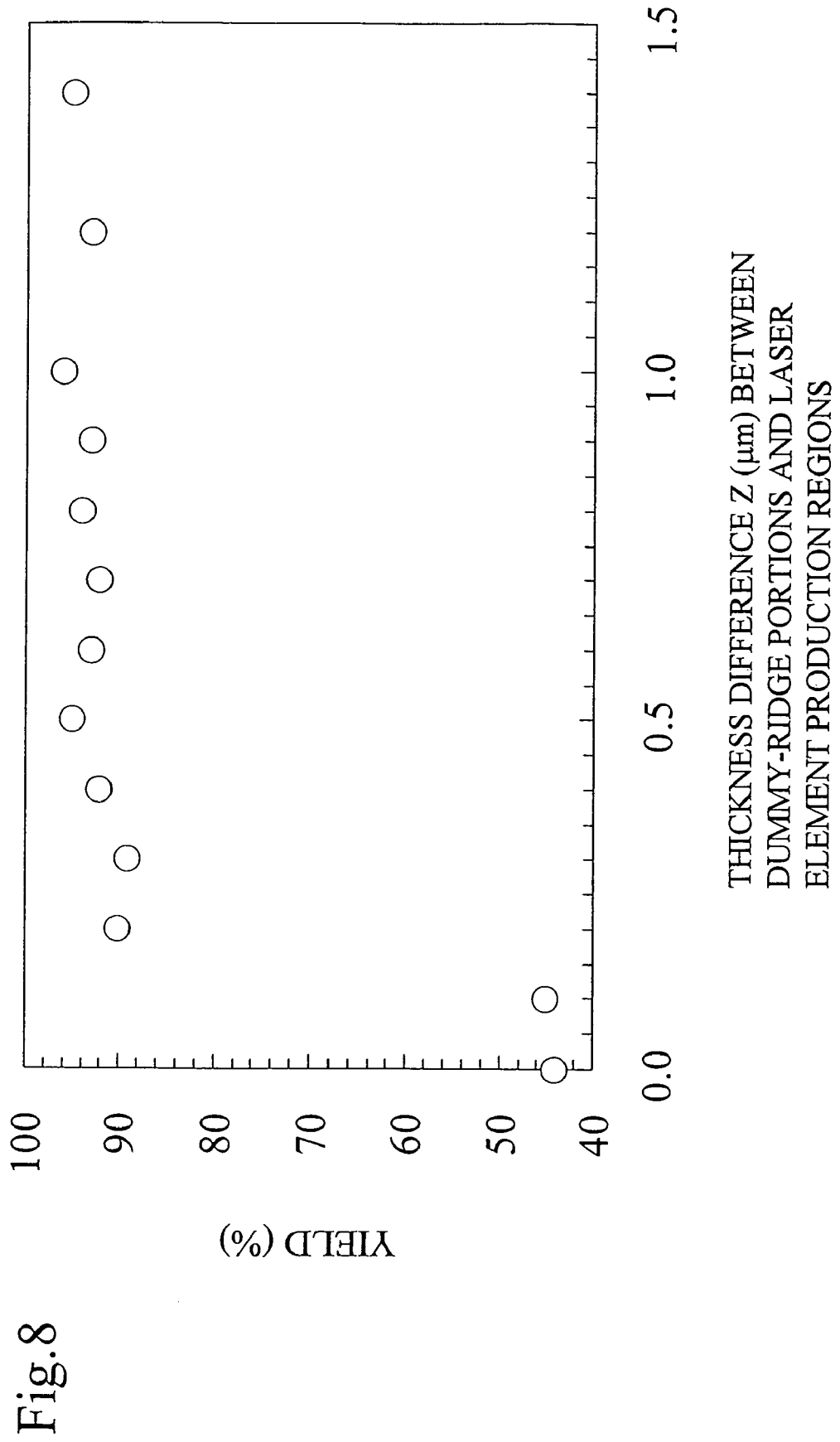
FIG. 8 is a diagram showing the correlation between the thickness difference Z between a dummy-ridge portion and a laser element production region and yields.

FIG. 8 shows, for the case in which junction-down mounting is performed, the correlation between the yield and the difference Z (see FIG. 3) in the thickness of the nitride semiconductor growth layer 12 between the portion thereof grown in the dummy-ridge portions 13 and the portion thereof grown in the laser element production regions 19. When the value of Z was smaller than 0.2 µm, the ridge stripe 14 and the stripe 20 tended to receive pressure, and thus the ridge stripe 14 tended to be damaged, resulting in remarkably low yields. Specifically, as shown in FIG. 8, as the value of Z becomes smaller than 0.2 µm, the yield sharply lowers. Hence, it is preferable that the difference Z in the thickness of the nitride semiconductor growth layer 12 between the portion thereof grown in the dummy-ridge portions 13 and the portion thereof grown in the laser element production regions 19 be 0.2 µm or more.

Moreover, as shown in FIG. 5, when the Al content ratio is 0.03 or more, the difference Z in the thickness of the nitride semiconductor growth layer 12 between the portion thereof grown in the dummy-ridge portions 13 and the portion thereof grown in the laser element production regions 19 is 0.2 µm or more. Hence, the Al content ratio in the AlGaN layer included in the nitride semiconductor growth layer 12 laid on the processed substrate 11 needs to be 0.03 or more. It has been found that, when the Al content ratio in the AlGaN layer is 0.03 or more, if the total thickness of both p-type and n-type AlGaN layers is 1 µm or more, the difference Z in the thickness of the nitride semiconductor growth layer 12 between the portion thereof grown in the dummy-ridge portions 13 and the portion thereof grown in the laser element production regions 19 is 0.2 µm or more. Hence, the AlGaN layer needs to be such that the Al content ratio therein is 0.03 or more and that the total thickness of p-type and n-type layers is 1 µm or more.

SECOND EMBODIMENT

Figure 9:
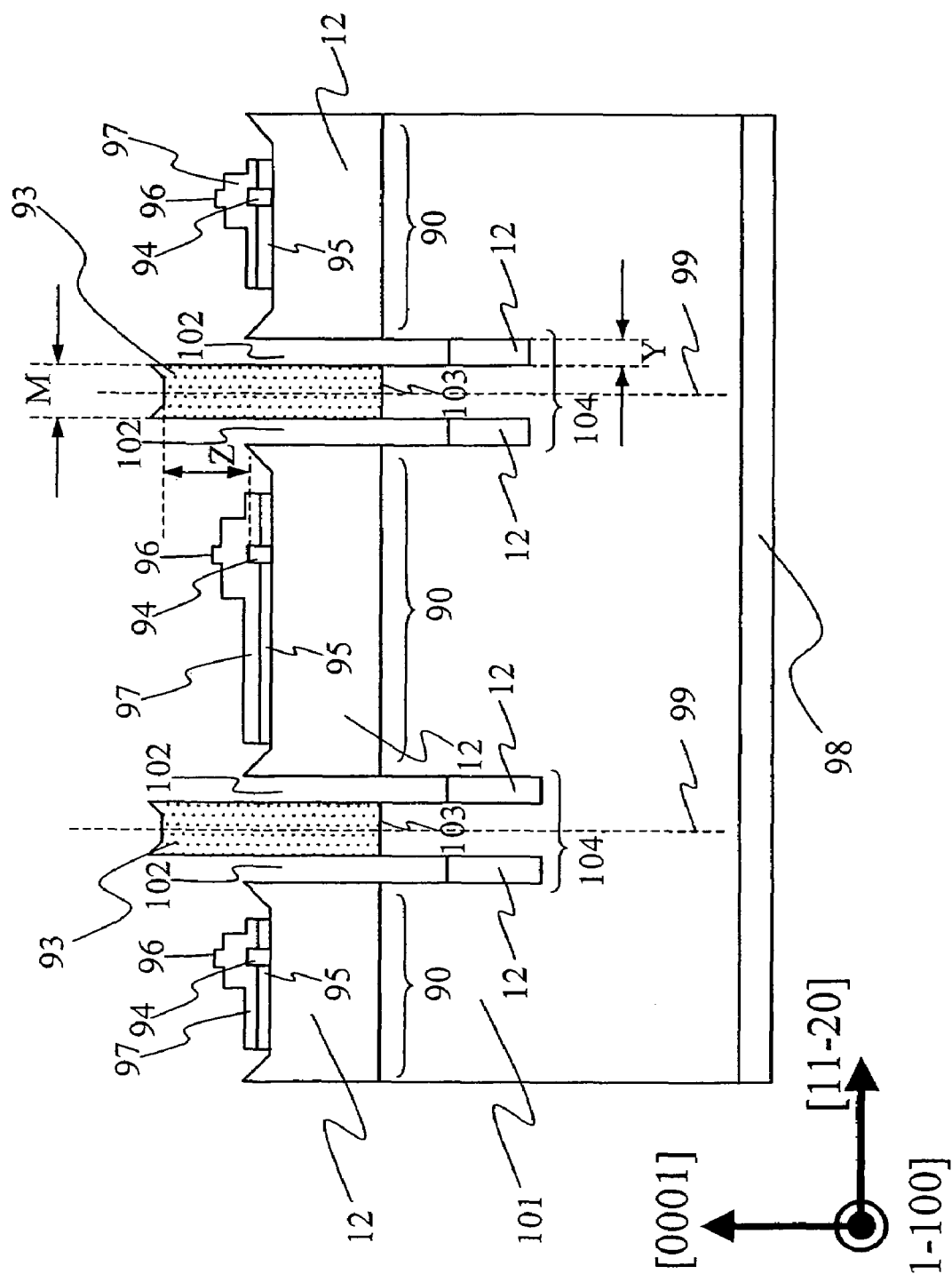
FIG. 9 is a schematic sectional view of part of a wafer having nitride semiconductor laser elements formed thereon in a second embodiment of the invention.

A second embodiment of the invention will be described below with reference to the relevant drawings. This embodiment deals with a nitride semiconductor laser element as an example of a semiconductor element. FIG. 9 is a schematic sectional view of part of a wafer having nitride semiconductor laser elements formed thereon in this embodiment. FIG. 10a is a schematic sectional view of a processed substrate 101 before a nitride semiconductor growth layer 12 as shown in FIG. 4 is laid thereon, and FIG. 10b is a top view of FIG. 10a. In each of these diagrams, the plane orientations are shown together. The nitride semiconductor growth layer 12 in the nitride semiconductor laser element shown in FIG. 9 is produced by forming nitride semiconductor thin films structured as shown in FIG. 4.

First, the processed substrate 101 of the nitride semiconductor laser element shown in FIG. 9 will be described. Unlike the processed substrate 11 used in the first embodiment, in which the engraved regions 16 each include a single depressed portion, the processed substrate 101 has, as shown in FIGS. 10a and 10b, engraved regions 104 that each include two depressed portions 102 extending in the [1-100] direction and a narrow flat portion 103 sandwiched between those two depressed portions 102. The narrow flat portion 103 has a flat surface and has a width M of 100 µm or less. The engraved regions 104 are formed through steps, involving ordinary photolithography and etching, similar to those performed in the first embodiment, and therefore no detailed explanations will be given in this respect.

In the nitride semiconductor laser element shown in FIG. 9, on the processed substrate 101 produced by forming the engraved regions 104 thereon, the nitride semiconductor growth layer 12 formed by laying together the plurality of nitride semiconductor thin films shown in FIG. 4 is formed. Moreover, on the surface of the nitride semiconductor growth layer 12, in laser element production regions 90 sandwiched between adjacent engraved regions 104, there are formed ridge stripes 94 serving as laser light waveguides and a SiO$_2$ film 95 for current constriction in such a way that the ridge stripes 94 are sandwiched between different patches of the SiO$_2$ film 95. Then, on the surface of the ridge stripes 94 and of the SiO$_2$ film 95, p-side electrodes 97 are formed, and, on the bottom surface of the processed substrate 101, an n-side electrode 98 is formed. The elevated portions on the surface of the p-side electrodes 97 located right above the ridge stripes 94 are called stripes 96. How this nitride semiconductor laser element is produced and other features thereof are the same as in the first embodiment unless specifically described below; therefore, for detailed explanations, the description of the first embodiment is to be referred to, and no overlapping explanations will be repeated.

Moreover, dummy-ridge portions 93 are formed by laying the nitride semiconductor growth layer 12 thicker on the surface of the narrow flat portions 103 than on the laser element production regions 90 sandwiched between the engraved regions 104. As in the first embodiment, the dummy-ridge portions 93 thus formed prevent the already-formed ridge stripes 94 from being damaged when mounting is performed in the mounting step. By giving the narrow flat portions 103, each sandwiched between two depressed portions 102, a width M of 100 μm or less in the direction parallel to the [11-20] direction as described above, as against in the first embodiment, the difference Z in the thickness of the nitride semiconductor thin films between the portion thereof laid on the dummy-ridge portions 93 and the portion thereof grown on the laser element production regions 90 can be made large even when the Al content ratio is small. That is, in this embodiment, not only in AlGaN films but also in GaN films (where the Al content ratio is zero), the growth rate at which the nitride semiconductor thin films grow on the dummy-ridge portions 93 is higher than the growth rate at which the nitride semiconductor thin films grow on the laser element production regions 90.

The wafer thus having nitride semiconductor laser elements formed thereon is then cleaved in the direction perpendicular to the resonator direction (the [1-100] direction), in which the ridge stripes 94 extend, so that the wafer is split into bars and thereby two resonator end facets are formed. How these resonator end facets are formed, how protective films are vapor-deposited on the resonator end facets, etc. are the same as in the first embodiment, and therefore no detailed explanations will be given in these respects. Subsequently, chip separation is performed so that the bars, each having a plurality of nitride semiconductor laser elements formed in a row thereon as shown in FIG. 9, are split into discrete nitride semiconductor laser elements.

Here, in this embodiment, chip separation is performed along division lines 99 running through middle portions of the dummy-ridge portions 93 after scribing or the like is performed with a diamond pen in middle portions of the surface of the dummy-ridge portions 93. Here, scribing does not necessarily have to be performed on the top surface of the dummy-ridge portions 93, but may be performed on the bottom surface of the processed substrate 101. Moreover, two depressed portions 102 are formed on both sides of each dummy-ridge portion 93. The nitride semiconductor growth layer 12 is laid in the depressed portions 102, starting from the floor surface thereof, so that the depressed portions 102 are partly filled by the nitride semiconductor growth layer 12. That is, the depressed portions 102 are not completely filled by the nitride semiconductor growth layer 12. Thus, grooves are formed in the depressed portions 102, and these grooves serve as guides for chip separation. Thus, during chip separation, even if the wafer breaks in an unintended direction, the depressed portions 102 located on both sides of the dummy-ridge portions 93 prevent separation from proceeding away therefrom. Thus, chip separation can be performed at high yields.

Figure 11:
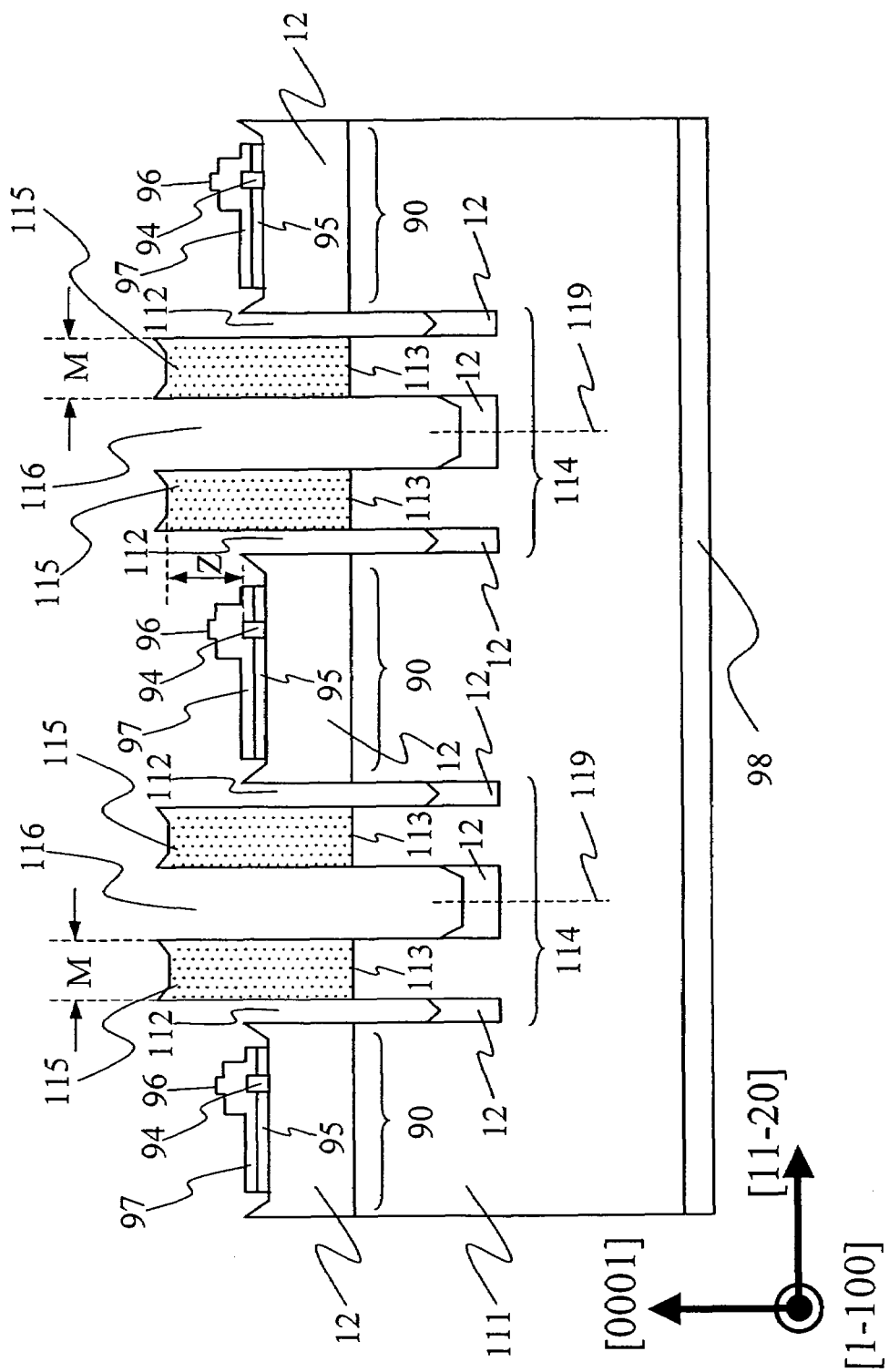
FIG. 11 is a schematic sectional view of part of a wafer having nitride semiconductor laser elements formed thereon in another example of the second embodiment of the invention.

In a case where, for example, the width M of the dummy-ridge portions 93 is small and thus it is difficult to perform scribing on the surface of the dummy-ridge portions 93, it is possible to use, instead of the processed substrate 101, a processed substrate 111 as shown in FIG. 11, which shows another example of the structure of this embodiment. In this processed substrate 111, each engraved region 114 includes two depressed portions 112 with a narrow opening width, a depressed portion 116 with an opening width wide enough to permit scribing to be performed therein, and two narrow flat portions 113 sandwiched between those depressed portions 112 and 116. In this case, when chip separation is performed, scribing is performed on the surface of the nitride semiconductor growth layer 12 grown on the floor surface of the depressed portions 116 each sandwiched between two dummy-ridge portions 115 formed as a result of the nitride semiconductor growth layer 12 growing on the surface of the narrow flat portions 113. By so doing, chip separation is performed along division lines 119 running along middle portions of the depressed portions 116. Here, scribing does not necessarily have to be performed on the surface of the nitride semiconductor growth layer 12 grown on the floor surface of the depressed portions 116, but may be performed on the bottom surface of the processed substrate 111 right below the depressed portions 116.

When chip separation is performed in the manner described above, the depressed portions 112 and 116 are not completely filled by the nitride semiconductor growth layer 12, but are only partly filled by the nitride semiconductor growth layer 12 that is laid in the depressed portions 112 and 116 starting from the floor surface thereof, with grooves formed therein. These grooves formed in the depressed portions 112 and 116 serve as guides for chip separation. Thus, during chip separation, even if the wafer breaks in an unintended direction, the grooves formed in the depressed portions 112 and 116 located on both sides of the engraved regions 114 serve as guides and prevent separation from proceeding away therefrom. Thus, chip separation can be performed at high yields.

Figure 12:
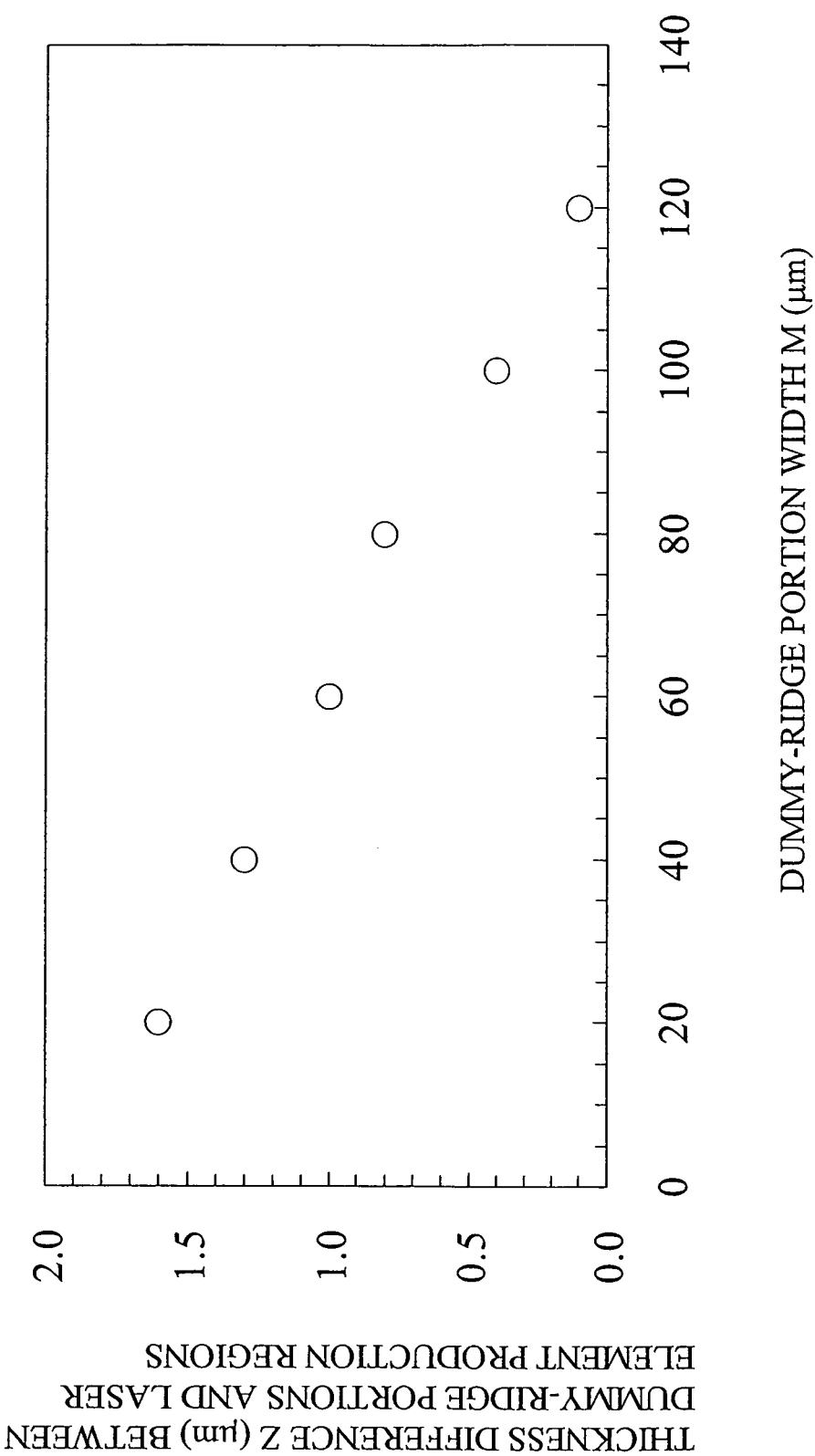
FIG. 12 is a diagram showing the correlation between the width M of a dummy-ridge portion and the thickness difference Z between the dummy-ridge portion and a laser element production region.

FIG. 12 shows the correlation between the width M (see FIG. 9 or 11) of the dummy-ridge portions 93 or 115 and the difference Z (see FIG. 9) in the thickness of the nitride semiconductor thin films between the portions thereof laid on the narrow flat portions 103 or 113 and the portions thereof laid on the laser element production regions 90. The graph of FIG. 12 shows the following. When the width M of the dummy-ridge portions 93 or 115 is 120 μm, the difference Z in the thickness of the nitride semiconductor thin films is approximately 0.1 μm; by contrast, when the width M is 100 μm or less, the difference Z in the thickness of the nitride semiconductor thin films is greater, namely approximately 0.5 μm or more. That is, as the width M becomes smaller below 100 μm, the growth rate of the nitride semiconductor thin films in the narrow flat portions 103 or 113 becomes higher than the growth rate of the nitride semiconductor thin films in the laser element production regions 90, and the difference Z in the thickness of the nitride semiconductor thin films becomes accordingly greater. Also in this case, the difference in growth rate between the above-mentioned two groups of regions was greater with AlGaN than with GaN. Incidentally, the results shown in the graph in FIG. 12 are those obtained when a 1 μm thick $Al_{0.03}Ga_{0.97}N$ layer was grown on a 1 μm thick GaN layer.

The reason that, as described above, the difference Z in the thickness of the nitride semiconductor thin films becomes large when the width M is 100 μm or less is believed to be as follows. First, as described previously, the re-evaporation probability of AlGaN tends to be low in edge portions of flat regions and high in central portions thereof. Second, in the narrow flat portions 103 or 113, the width M thereof is as small as 100 μm or less; this makes the flat regions, in which the re-evaporation probability is high, narrow, and thus makes the influence of the edge portions stronger. This lowers the re-evaporation probability of the narrow flat portions 103 or 113 as a whole, resulting in a high growth rate.

In this way, by forming, as non-engraved regions, narrow flat portions 103 or 113 so that the width M thereof is 100 μm or less and then growing nitride semiconductor thin films on the wafer, it is possible to form dummy-ridge portions 93 or 115 having a desired level difference relative to laser element production regions 90. Moreover, even if the length of the narrow flat portions 103 or 113 in the resonator direction (the [1-100] direction) is 100 μm or more, so long as their width M (in the [11-20] direction) is 100 μm or less, the same effects can be obtained. By giving the narrow flat portions 103 or 113 a length of 100 μm or less in the resonator direction, it is possible to more effectively obtain the level difference mentioned above.

THIRD EMBODIMENT

Figure 13:
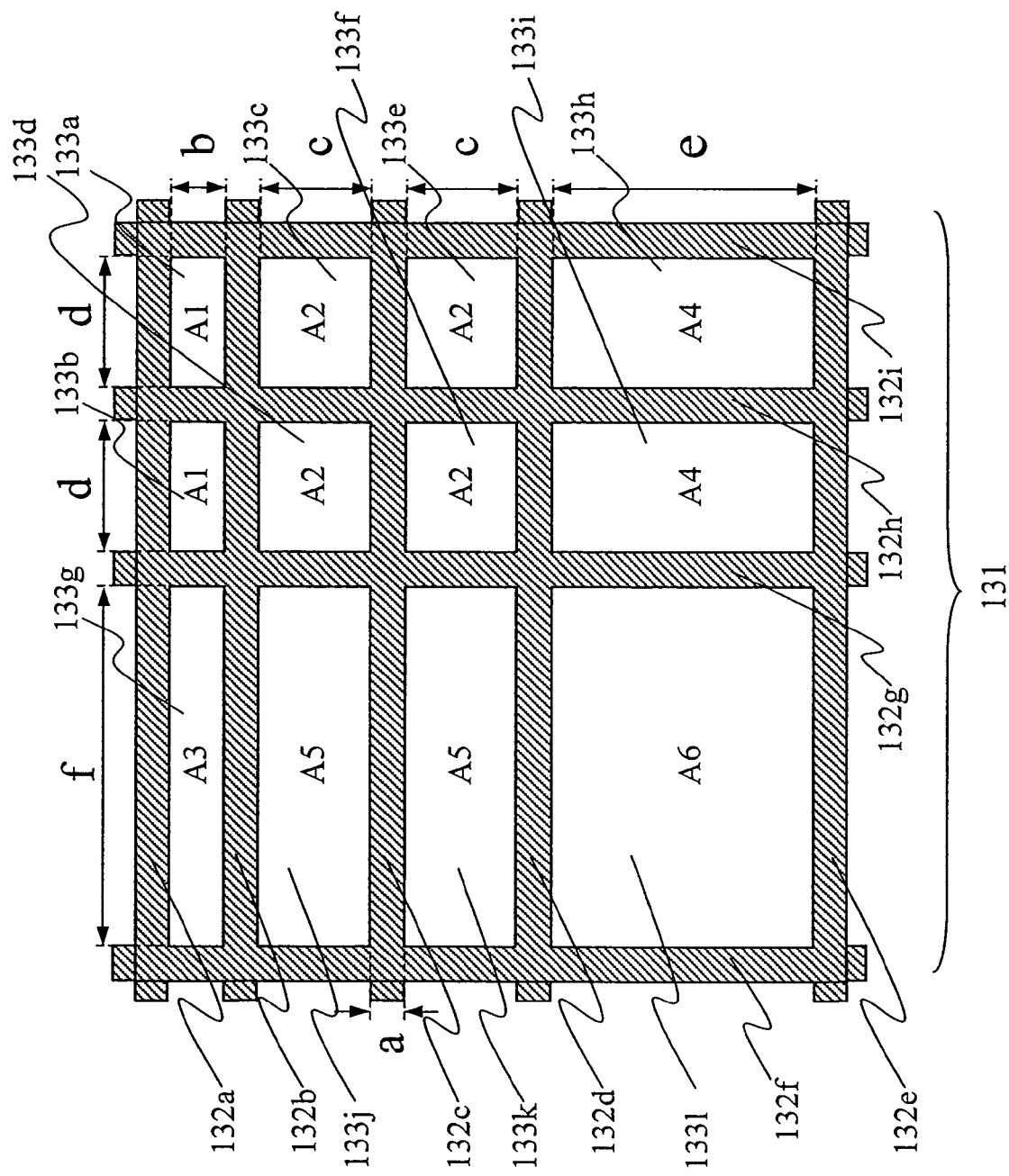
FIG. 13 is a top view of part of a processed substrate in a third embodiment of the invention.

A third embodiment of the invention will be described below with reference to the relevant drawings. FIG. 13 is a top view of part of a processed substrate 131 in this embodiment. In this embodiment, in the illustrated region on the processed substrate 131, engraved regions 132a to 132i are formed that have a structure similar to that of the engraved regions 16, 104, or 114 in the first or second embodiment. The engraved regions 132a to 132e are formed parallel to one another, and the engraved regions 132f to 132i are formed parallel to one another. The engraved regions 132a to 132e are formed perpendicularly to the engraved regions 132f to 132i.

With the engraved regions 132a to 132i formed as described above, let the distance between the engraved regions 132a and 132b be "b", let the distance between the engraved regions 132b and 132c and between the engraved regions 132c and 132d be "c", let the distance between the engraved regions 132d and 132e be "e", let the distance between the engraved regions 132f and 132g be "f", and let the distance between the engraved regions 132g and 132h and between the engraved regions 132h and 132i be "d". In this embodiment, these distances "b", "c", "d", "e", and "f" are assumed to be 30 μm, 60 μm, 80 μm, and 200 μm, respectively. The engraved regions 132a to 132i are formed so as to have a width "a" of 20 μm and a depth of 5 μm. Here, the engraved regions 132a to 132i form ridges 133a to 133l. The ridges 133a and 133b each have an area of "b"×"c"=A1, the ridges 133c, 133d, 133e, and 133f each have an area of "c"×"d"=A2, the ridge 133g has an area of "b"×"f"=A3, the ridges 133h and 133i each have an area of "d"×"e"=A4, the ridges 133j and 133k each have an area of "c"×"f"=A5, and the ridge 133l has an area of "e"×"f"=A6. In this embodiment, the areas A1, A2, A3, A4, A5, and A6 equal 2400 μm², 4800 μm², 6000 μm², 9600 μm², 12000 μm², and 24000 μm², respectively. Thus, 133a to 133l have increasingly large areas in the following order: 133a=133b<133c=133d=133e=133f<133g<133h=133i<133j=133k<133l.

In this way, as a result of the engraved regions 132a to 132i being formed in a grid-like pattern on the processed substrate 131, the ridges 133a to 133l having varying areas are formed. The smaller the area of the ridges 133a to 133l, the higher the growth rate of the nitride semiconductor thin films on them, and thus the higher the level of the growth surface of the nitride semiconductor thin films. That is, by forming the engraved regions 132a to 132i in a grid-like shape with varying intervals, and then appropriately setting the areas of the individual ridges, it is possible to obtain nitride semiconductor thin films with desired thicknesses.

When GaN or AlGaN is grown on the processed substrate 131 having the engraved regions 132a to 132i and the ridges 133a to 133l formed thereon as described above, the growth surface in the individual regions on the different ridges come to have varying levels. For example, in FIG. 13, the ridge 133a is 100 μm or less wide both in the longitudinal and transverse directions (specifically, 80 μm and 30 μm, respectively), and thus has an area A1 of 2400 μm, which is the smallest among all the ridges, and thus here the nitride semiconductor thin films have the greatest growth thickness. Thus, the growth surface of the films grown there has the highest level. In the other regions, as their areas increase from A1 to A2 to A3 to A4 to A5 to A6, the level of the growth surface lowers. The ridge 133l is more than 100 μm wide both in the longitudinal and transverse directions (specifically, 200 μm and 120 μm, respectively, and thus has an area A6 of 24000 μm². Here, the nitride semiconductor thin films have a growth thickness approximately equal to that obtained when the engraved regions 132a to 132i are not formed on the processed substrate 131.

Thus, let the level of the growth surface of the nitride semiconductor thin films on the ridges 133a to 133l be 133aT to 133lT, respectively, then the growth surface has increasingly higher levels in the following order: 133aT=133bT>133cT=133dT=133eT=133fT>133gT>133hT=133iT>133jT=133kT>133lT. In this way, before nitride semiconductor thin films are grown, ridges having varying areas are formed on the processed substrate 131. By thereafter growing nitride semiconductor thin films, it is possible to give the grown nitride semiconductor thin films varying surface levels according to the varying growth areas (ridge areas) on the individual ridges.

Figure 14:
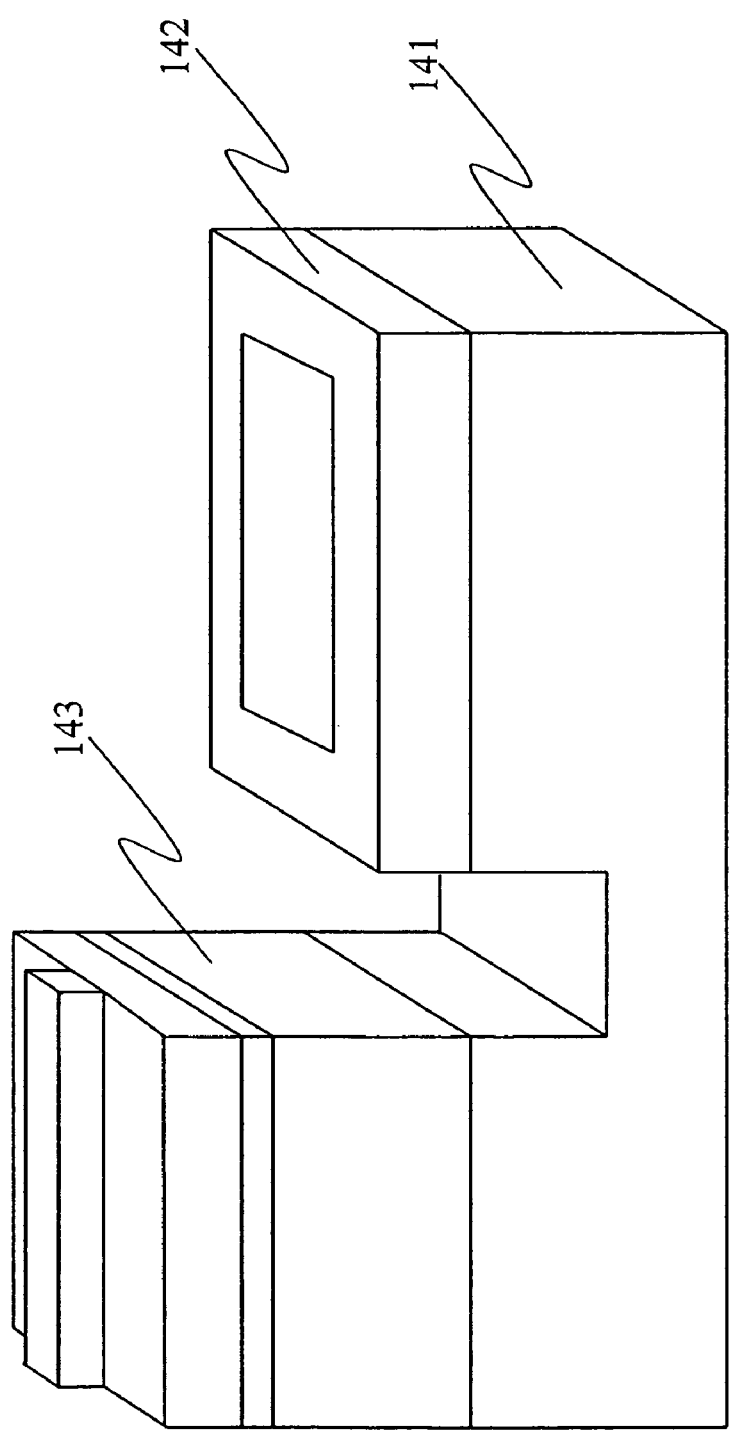
FIG. 14 is an exterior perspective view of a composite semiconductor device in the third embodiment of the invention.
Figure 15:
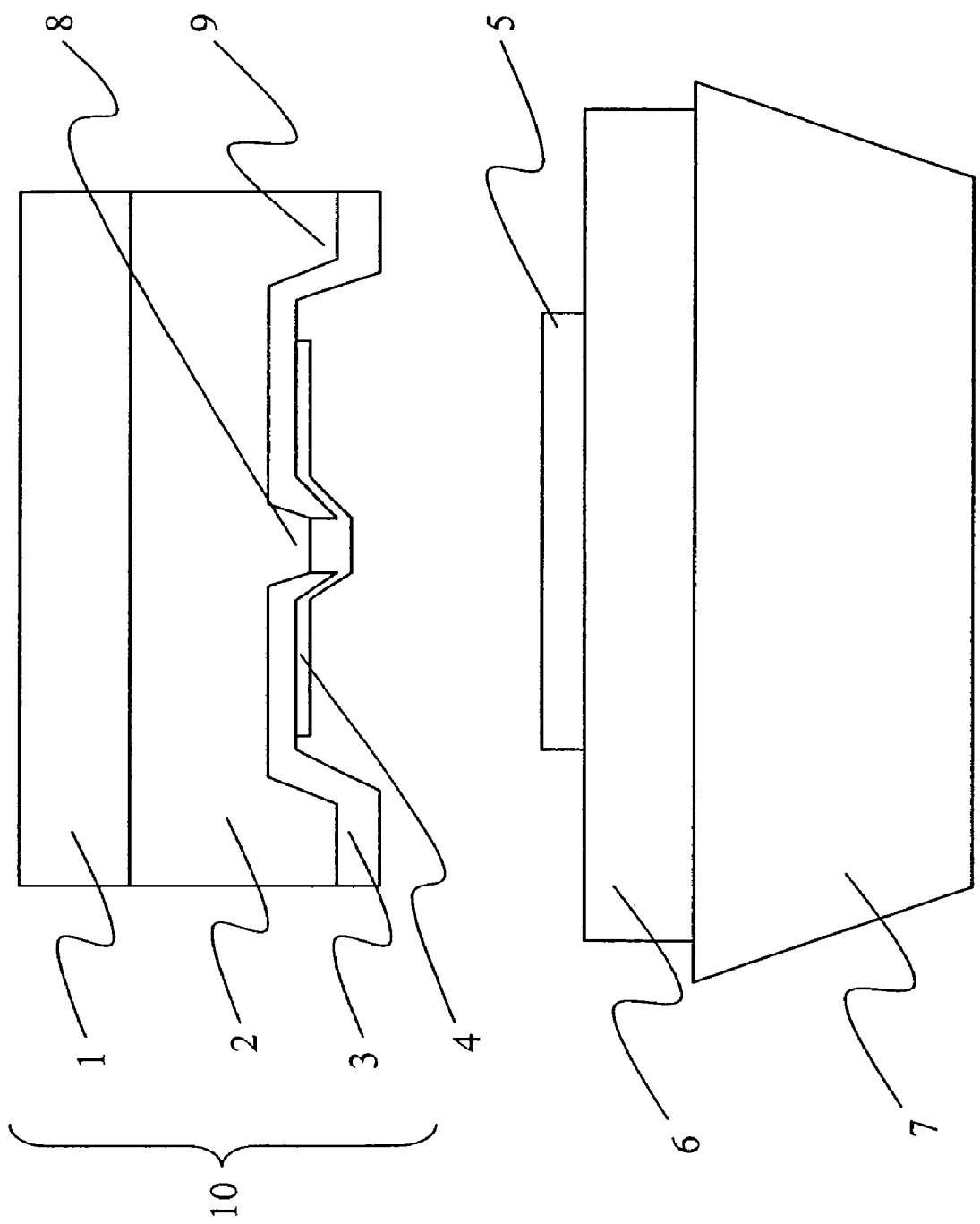
FIG. 15 is a diagram illustrating the junction-down mounting of a semiconductor element as conventionally practiced.

By exploiting the level differences obtained in the nitride semiconductor thin films in this way, it is possible to produce a composite semiconductor element by producing, for example, a nitride semiconductor laser and a PD (photodiode) on the same processed substrate. FIG. 14 shows an example of such a composite semiconductor. FIG. 14 shows a processed substrate 141 produced in the manner describe above along with a PD 142 and a nitride semiconductor laser element 143 formed on the processed substrate 141. On the surface of the processed substrate 141, since the area of the region on which the nitride semiconductor laser element 143 is formed is smaller than the area of the region on which the PD 142 is formed, the nitride semiconductor laser element 143 has a higher growth surface than the PD 142. This makes it possible to monitor, with the PD 142, the light emitted from the nitride semiconductor laser element 143 without intercepting it. It is also possible to incorporate an electronic device to produce a composite semiconductor device.

This embodiment deals with a case in which the laser formed on the processed substrate 141 is a nitride semiconductor laser, but the laser may be a semiconductor laser based on any other type of semiconductor such as a group III-V compound semiconductor. The first and second embodiments both deal with nitride semiconductor laser elements, but they may be applied to any semiconductor elements other than nitride semiconductor laser elements.

What is claimed is:

1. A method for fabricating a semiconductor element comprising:
   a first step of producing a processed substrate by forming, on a substrate having a nitride semiconductor layer as at least part of a surface thereof, an engraved region including at least one depressed portion and a ridge portion as a non-engraved region; and
   a second step of laying a nitride-semiconductor layered-structure portion including at least one type of nitride semiconductor thin film both in the engraved region and on a surface of the ridge portion,
   wherein, in the first step, the engraved region is so formed as to include two or more depressed portions and a narrow flat portion sandwiched therebetween, the narrow flat portion having a width of 100 µm or less in a direction perpendicular to a first direction in which the engraved region extends, and
   wherein, in the second step,
      a first dummy-ridge portion is formed on a region of the ridge portion close to the engraved region by making a thickness of the nitride semiconductor layered-structure portion laid on the region of the ridge portion close to the engraved region as measured from the surface of the ridge portion to a surface of the nitride semiconductor layered-structure portion greater than a thickness of the nitride semiconductor layered-structure portion laid on a semiconductor element production region, which is a region of the ridge portion other than the region thereof close to the engraved region, as measured from the surface of the ridge portion to the surface of the nitride semiconductor layered-structure portion, and
      a second dummy-ridge portion is formed in the narrow flat portion by making a thickness of the nitride semiconductor layered-structure portion laid on the narrow flat portion as measured from the surface of the narrow flat portion to the surface of the nitride semiconductor layered-structure portion greater than the thickness of the nitride semiconductor layered-structure portion laid on the semiconductor element production region as measured from the surface of the ridge portion to the surface of the nitride semiconductor layered-structure portion.

2. A method for fabricating a semiconductor element comprising:
   a first step of producing a processed substrate by forming, on a substrate having a nitride semiconductor layer as at least part of a surface thereof, an engraved region including at least one depressed portion and a ridge portion as a non-engraved region; and
   a second step of laying a nitride semiconductor layered-structure portion including at least one type of nitride semiconductor thin film both in the engraved region and on a surface of the ridge portion,
   wherein, in the first step, the engraved region is so formed as to include three depressed portions and two narrow flat portions sandwiched therebetween, the narrow flat portions each having a width of 100 µm or less in a direction perpendicular to a first direction in which the engraved region extends, and
   wherein, in the second step,
      a first dummy-ridge portion is formed on a region of the ridge portion close to the engraved region by making a thickness of the nitride semiconductor layered-structure portion laid on the region of the ridge portion close to the engraved region as measured from the surface of the ridge portion to a surface of the nitride semiconductor layered-structure portion greater than a thickness of the nitride semiconductor layered-structure portion greater than a thickness of the nitride semiconductor layered-structure portion laid on a semiconductor element production region, which is a region of the ridge portion other than the region thereof close to the engraved region, as measured from the surface of the ridge portion to the surface of the nitride semiconductor layered-structure portion, and
      two second dummy-ridge portions are formed in the narrow flat portions by making a thickness of the nitride semiconductor layered-structure portion laid on the narrow flat portions as measured from the surface of the narrow flat portions to the surface of the nitride semiconductor layered-structure portion greater than the thickness of the nitride semiconductor layered-structure portion laid on the semiconductor element production region as measured from the surface of the ridge portion to the surface of the nitride semiconductor layered-structure portion.

3. The method of claim 1, further comprising:
   a third step of producing a semiconductor element in the semiconductor element production region formed in the second step;
   a fourth step of cleaving the processed substrate in a direction perpendicular to the first direction to form a bar having a plurality of the semiconductor elements mounted thereon; and
   a fifth step of performing chip separation by splitting the bar in a direction parallel to the first direction to separate the semiconductor elements on the bar into discrete chips,
   wherein, in the fifth step, the chip separation is performed after forming a scribe line parallel to the first direction by performing scribing in a middle portion on the second dummy-ridge portion or on a bottom surface of part of the processed substrate located right below the second dummy-ridge portion.

4. The method of claim 2, further comprising:
   a third step of producing a semiconductor element in the semiconductor element production region formed in the second step;
   a fourth step of cleaving the processed substrate in a direction perpendicular to the first direction to form a bar having a plurality of the semiconductor elements mounted thereon; and
   a fifth step of performing chip separation by splitting the bar in a direction parallel to the first direction to separate the semiconductor elements on the bar into discrete chips,
   wherein, in the fifth step, the chip separation is performed after forming a scribe line parallel to the first direction by performing scribing in the nitride semiconductor layered-structure portion laid in the depressed portion sandwiched between the two narrow flat portions in the engraved region or on a bottom surface of part of the processed substrate located right below that depressed portion.

* * * * *